US010221898B2

(12) United States Patent
Castillo et al.

(10) Patent No.: US 10,221,898 B2
(45) Date of Patent: Mar. 5, 2019

(54) HINGE CLUTCH

(71) Applicant: Microsoft Technology Licensing, LLC, Redmond, WA (US)

(72) Inventors: Marlo E. Castillo, Seattle, WA (US); Daniel C. Park, Woodinville, WA (US); Anthony J. Hewett, Duvall, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 84 days.

(21) Appl. No.: 15/232,750

(22) Filed: Aug. 9, 2016

(65) Prior Publication Data
US 2018/0003245 A1 Jan. 4, 2018

Related U.S. Application Data

(60) Provisional application No. 62/357,880, filed on Jul. 1, 2016.

(51) Int. Cl.
*F16D 15/00* (2006.01)
*G06F 1/16* (2006.01)
(Continued)

(52) U.S. Cl.
CPC ............ *F16D 15/00* (2013.01); *E05D 3/122* (2013.01); *E05D 11/10* (2013.01); *F16D 23/00* (2013.01); *F16D 27/108* (2013.01); *F16D 27/118* (2013.01); *F16H 1/28* (2013.01); *F16M 11/10* (2013.01); *F16M 11/18* (2013.01); *F16M 11/2021* (2013.01); *F16M 11/24* (2013.01); *G06F 1/16* (2013.01); *G06F 1/1681* (2013.01);
(Continued)

(58) Field of Classification Search
CPC ......... F16D 15/00; F16D 23/00; E05D 3/122; E05D 11/10; F16H 1/28; G06F 1/1681
USPC ............... 361/679.01–679.3, 679.55–679.59; 16/354
See application file for complete search history.

(56) References Cited

U.S. PATENT DOCUMENTS 4,802,605 A 2/1989 Salmon et al.
4,825,395 A 4/1989 Kinser et al.
(Continued)

FOREIGN PATENT DOCUMENTS

EP 1507387 A1 2/2005
JP 2008285003 A * 11/2008
(Continued)

OTHER PUBLICATIONS

"Are there any types of DC motors that self-lock themselves?", retrieved at <<http://electronics.stackexchange.com/questions/91916/are-there-any-types-of-dc-motors-that-self-lock-themselves>>, Nov. 26, 2013, 2 pages.
(Continued)

Primary Examiner — Nidhi Thaker
(74) Attorney, Agent, or Firm — Rainer Patents, P.S.

(57) ABSTRACT

The description relates to devices that include hinged portions and controlling rotation of the portions. One example can include a display that is configured to rotate relative to an axis. The example can also include a clutch assembly interposed between first and second planet gear assemblies positioned along the axis. The first and second planet gears configured to multiply resistance to rotation around the axis that is supplied by the clutch assembly.

25 Claims, 21 Drawing Sheets

(51) Int. Cl.

| | | |
|---|---|---|
| *E05D 3/12* | (2006.01) | |
| *E05D 11/10* | (2006.01) | |
| *F16D 23/00* | (2006.01) | |
| *F16H 1/28* | (2006.01) | |
| *F16M 11/10* | (2006.01) | |
| *F16M 11/20* | (2006.01) | |
| *F16M 11/24* | (2006.01) | |
| *H05K 5/00* | (2006.01) | |
| *H05K 5/02* | (2006.01) | |
| *F16M 11/18* | (2006.01) | |
| *F16D 27/108* | (2006.01) | |
| *F16D 27/118* | (2006.01) | |

(52) U.S. Cl.
CPC ......... *H05K 5/0017* (2013.01); *H05K 5/0226* (2013.01); *H05K 5/0234* (2013.01); *E05Y 2900/606* (2013.01)

(56) References Cited

U.S. PATENT DOCUMENTS

| | | |
|---|---|---|
| 5,200,913 A | 4/1993 | Hawkins et al. |
| 5,235,495 A | 8/1993 | Blair et al. |
| 5,239,730 A | 8/1993 | Grass |
| 5,278,725 A | 1/1994 | Konno et al. |
| 5,394,297 A | 2/1995 | Toedter |
| 5,498,165 A | 3/1996 | Tseng |
| 5,729,429 A | 3/1998 | Margaritis et al. |
| 5,876,008 A | 3/1999 | Sweere et al. |
| 5,954,642 A | 9/1999 | Johnson et al. |
| 6,079,993 A | 6/2000 | Laine |
| 6,101,676 A * | 8/2000 | Wahl ............... E05D 11/082 16/340 |
| 6,223,393 B1 | 5/2001 | Knopf |
| 6,262,885 B1 | 7/2001 | Emma et al. |
| 6,381,125 B1 | 4/2002 | Mizoguchi et al. |
| 6,503,167 B1 | 1/2003 | Sturm |
| 6,530,123 B1 | 3/2003 | Wahlstedt |
| 6,730,867 B2 | 5/2004 | Hyp |
| 6,766,180 B2 | 7/2004 | Doraiswamy et al. |
| 6,785,935 B2 * | 9/2004 | Ahn ............... H04M 1/0216 16/221 |
| 6,822,857 B2 | 11/2004 | Jung et al. |
| 6,871,384 B2 | 3/2005 | Novin et al. |
| 7,043,797 B2 | 5/2006 | Cau |
| 7,054,147 B2 | 5/2006 | Maatta et al. |
| 7,145,768 B2 | 12/2006 | Hillman et al. |
| 7,289,315 B2 | 10/2007 | Hillman et al. |
| 7,301,759 B2 | 11/2007 | Hsiung |
| 7,461,433 B2 | 12/2008 | Pan et al. |
| 7,478,786 B2 | 1/2009 | Copeland |
| 7,506,853 B2 | 3/2009 | Sweere et al. |
| 7,643,275 B2 | 1/2010 | Williams et al. |
| 7,654,755 B2 | 2/2010 | Orf et al. |
| 7,694,919 B2 | 4/2010 | Lee |
| 7,766,288 B2 | 8/2010 | Kim et al. |
| 7,886,903 B1 | 2/2011 | Wurzelbacher, Jr. et al. |
| 8,035,957 B2 | 10/2011 | Jung |
| 8,075,128 B2 | 12/2011 | Park et al. |
| 8,104,142 B2 | 1/2012 | Lowry et al. |
| 8,230,553 B2 | 7/2012 | Degner et al. |
| 8,230,992 B2 | 7/2012 | Law et al. |
| 8,259,437 B2 | 9/2012 | Vesely |
| 8,310,468 B2 | 11/2012 | Martin |
| 8,400,767 B2 | 3/2013 | Yeon et al. |
| 8,505,169 B2 | 8/2013 | Wood et al. |
| 8,534,635 B2 | 9/2013 | Yang et al. |
| 8,537,533 B2 | 9/2013 | Sung |
| 8,549,710 B2 | 10/2013 | Novin |
| 8,724,306 B2 | 5/2014 | Ashcraft et al. |
| 8,769,772 B2 | 7/2014 | Griffin et al. |
| 8,787,016 B2 | 7/2014 | Rothkopf et al. |
| 8,811,005 B2 | 8/2014 | Casebolt et al. |
| 8,897,033 B2 | 11/2014 | Slipy et al. |
| 8,922,995 B2 | 12/2014 | Su |
| 8,925,153 B1 | 1/2015 | McGrath |
| 9,010,822 B2 | 4/2015 | Rasmussen et al. |
| 9,013,865 B2 | 4/2015 | Chen et al. |
| 9,064,431 B2 | 6/2015 | Ahn et al. |
| 9,072,179 B2 | 6/2015 | Su |
| 9,095,253 B2 | 8/2015 | Hinman et al. |
| 9,104,372 B2 | 8/2015 | Frenael |
| 9,155,235 B2 | 10/2015 | Lindblad et al. |
| 9,291,299 B2 | 3/2016 | Richard et al. |
| 2004/0066614 A1 | 4/2004 | Hong |
| 2004/0090754 A1 * | 5/2004 | Takumori ............... G06F 1/1616 361/755 |
| 2004/0216273 A1 * | 11/2004 | Kang ................... G06F 1/1616 16/264 |
| 2005/0247832 A1 | 11/2005 | Cho et al. |
| 2006/0039104 A1 | 2/2006 | Wang et al. |
| 2007/0230095 A1 | 10/2007 | Wu |
| 2008/0068494 A1 | 3/2008 | Kim |
| 2008/0122736 A1 | 5/2008 | Ronzani et al. |
| 2010/0124009 A1 | 5/2010 | Jiang et al. |
| 2011/0051437 A1 | 3/2011 | Ng et al. |
| 2011/0062304 A1 | 3/2011 | Hsieh et al. |
| 2011/0286171 A1 | 11/2011 | Franz et al. |
| 2011/0299233 A1 | 12/2011 | Kim |
| 2012/0036679 A1 | 2/2012 | Chen |
| 2012/0091298 A1 | 4/2012 | Huang |
| 2012/0102675 A1 | 5/2012 | Lee et al. |
| 2013/0010424 A1 | 1/2013 | Degner et al. |
| 2013/0044454 A1 | 2/2013 | Lin et al. |
| 2014/0063750 A1 | 3/2014 | Mau et al. |
| 2014/0085798 A1 | 3/2014 | Myerchin |
| 2014/0159995 A1 | 6/2014 | Adams et al. |
| 2014/0215758 A1 | 8/2014 | Franklin et al. |
| 2014/0218634 A1 | 8/2014 | Onda |
| 2014/0268555 A1 | 9/2014 | Kurczewski |
| 2014/0298616 A1 | 10/2014 | Baer |
| 2014/0321041 A1 | 10/2014 | Hsu et al. |
| 2014/0353453 A1 | 12/2014 | Quijano et al. |
| 2015/0000435 A1 | 1/2015 | Zhang et al. |
| 2015/0048230 A1 | 2/2015 | Satterfield |
| 2015/0092335 A1 | 4/2015 | Patrick et al. |
| 2015/0097092 A1 | 4/2015 | Fu et al. |
| 2015/0121654 A1 | 5/2015 | Novin |
| 2015/0185709 A1 | 7/2015 | Vroom et al. |
| 2015/0277506 A1 | 10/2015 | Cheah et al. |
| 2015/0285233 A1 | 10/2015 | Theodore et al. |
| 2015/0336480 A1 | 11/2015 | Szakelyhidi et al. |
| 2015/0362692 A1 | 12/2015 | Lee et al. |
| 2015/0362962 A1 | 12/2015 | Lee et al. |

FOREIGN PATENT DOCUMENTS

| | | | |
|---|---|---|---|
| JP | 2008285003 A | * | 11/2008 |
| TW | M430129 U1 | | 5/2012 |
| WO | 1998/016144 A1 | | 4/1998 |
| WO | 2016022736 A1 | | 2/2016 |

OTHER PUBLICATIONS

"World's First "Ultra-Compact One-Way Clutch" Announced", retrieved at <<http://www.ntn.co.jp/english/news/new_products/news20020315_html#add1>>, Mar. 15, 2002, 2 pages.

U.S. Appl. No. 62/357,880 titled "Hinge Clutch", filed Jul. 1, 2016 by Inventors Castillo et al., 47 pages.

"Grass Products", retrieved at <<http://www.grass.at/uebersicht-nexis-click-on.html?L=1>>, on Dec. 24, 2015, 1 page.

"Humanscale M8 Monitor Arm", retrieved at <<http://www.thehumansolution.com/humanscale-m8-monitor-arm-sds.html>>, on Apr. 12, 2012, 3 pages.

"Prepara iPrep Tablet Stand with Stylus", retrieved at <<http://www.rakuten.com/prod/prepara-iprep-tablet-stand-with-stylus-white/256971780.html>>, on Dec. 29, 2015, 3 pages.

Korane, Kenneth, "Options for Designing the Best Hinge", retrieved at <<http://machinedesign.com/news/options-designing-best-hinge>>, Jul. 19, 2012, 4 pages.

(56) References Cited

OTHER PUBLICATIONS

Lenovo Yoga 3 Pro, captured by the Internet archive on Aug. 11, 2015 at <<http://shop.lenovo.com/us/en/laptops/lenovo/yoga-laptop-series/yoga-3-pro-laptop/>>, 2 pages.

Subramanian, et al., "Assembly Analysis of Interference Fits in Elastic Materials", Proceedings of 5th IFIP WG 5.5 International Precision Assembly Seminar, IFIP Advances in Information and Communication Technology, Feb. 14, 2010, 9 pages.

Westover, Brian, "HP Spectre x360 13t (13/4003)", captured by the Internet archive on Jul. 21, 2015 at <<http://in.pcmag.com/hp-spectre-x360-13t-13/4003/40964/review/hp-spectre-x360-13t-13/4003>>, 6 pages.

Non-Final Office Action dated Mar. 21, 2017 from U.S. Appl. No. 15/179,383, 40 pages.

Response filed May 18, 2017 to the Non-Final Office Action dated Mar. 21, 2017 from U.S. Appl. No. 15/179,383, 11 pages.

Requirement Restriction dated Jun. 8, 2017 from U.S. Appl. No. 15/139,197, 5 pages.

Notice of Allowance dated Apr. 20, 2017 from U.S. Appl. No. 15/099,238, 38 pages.

"International Search Report and Written Opinion Issued in PCT Application No. PCT/US2017/039606", dated Oct. 10, 2017, 11 Pages.

* cited by examiner

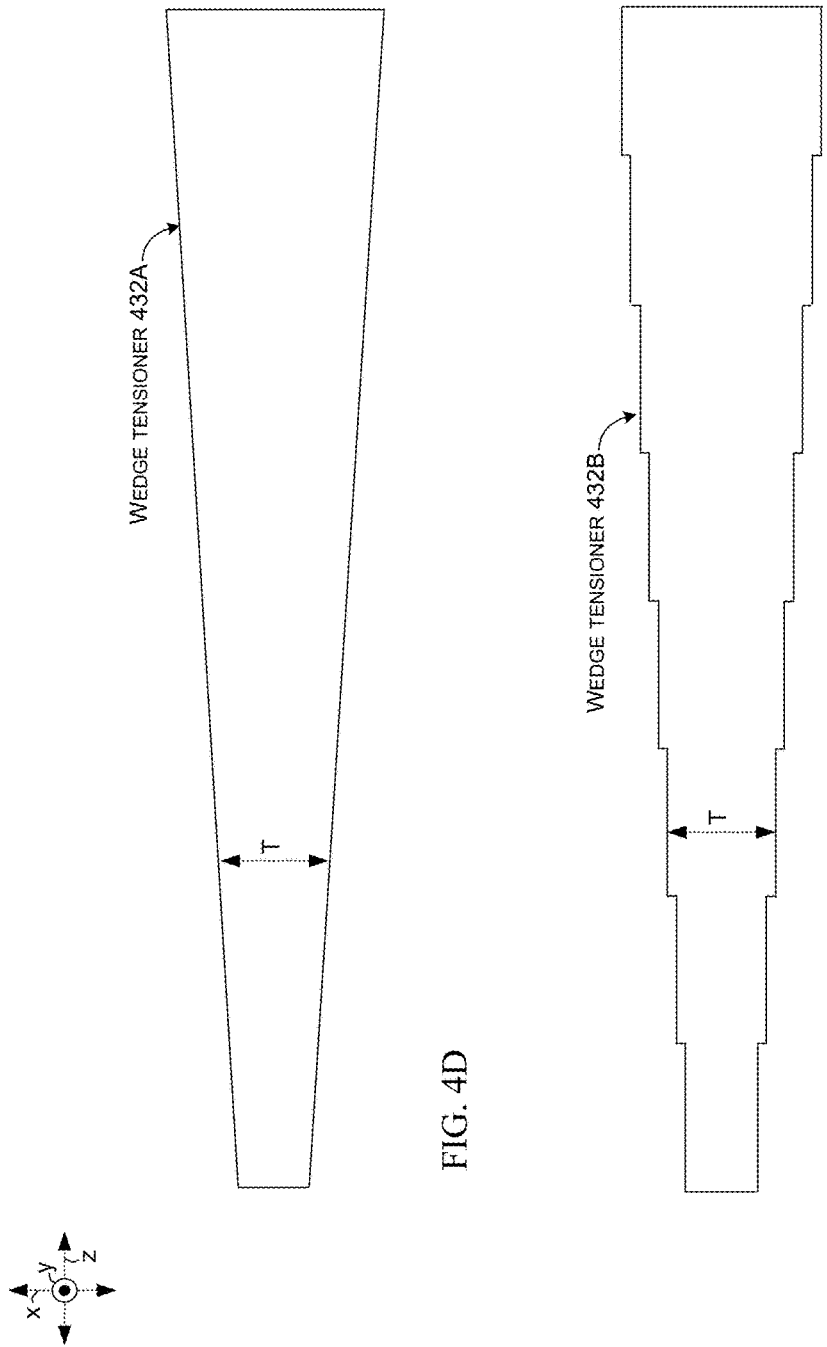

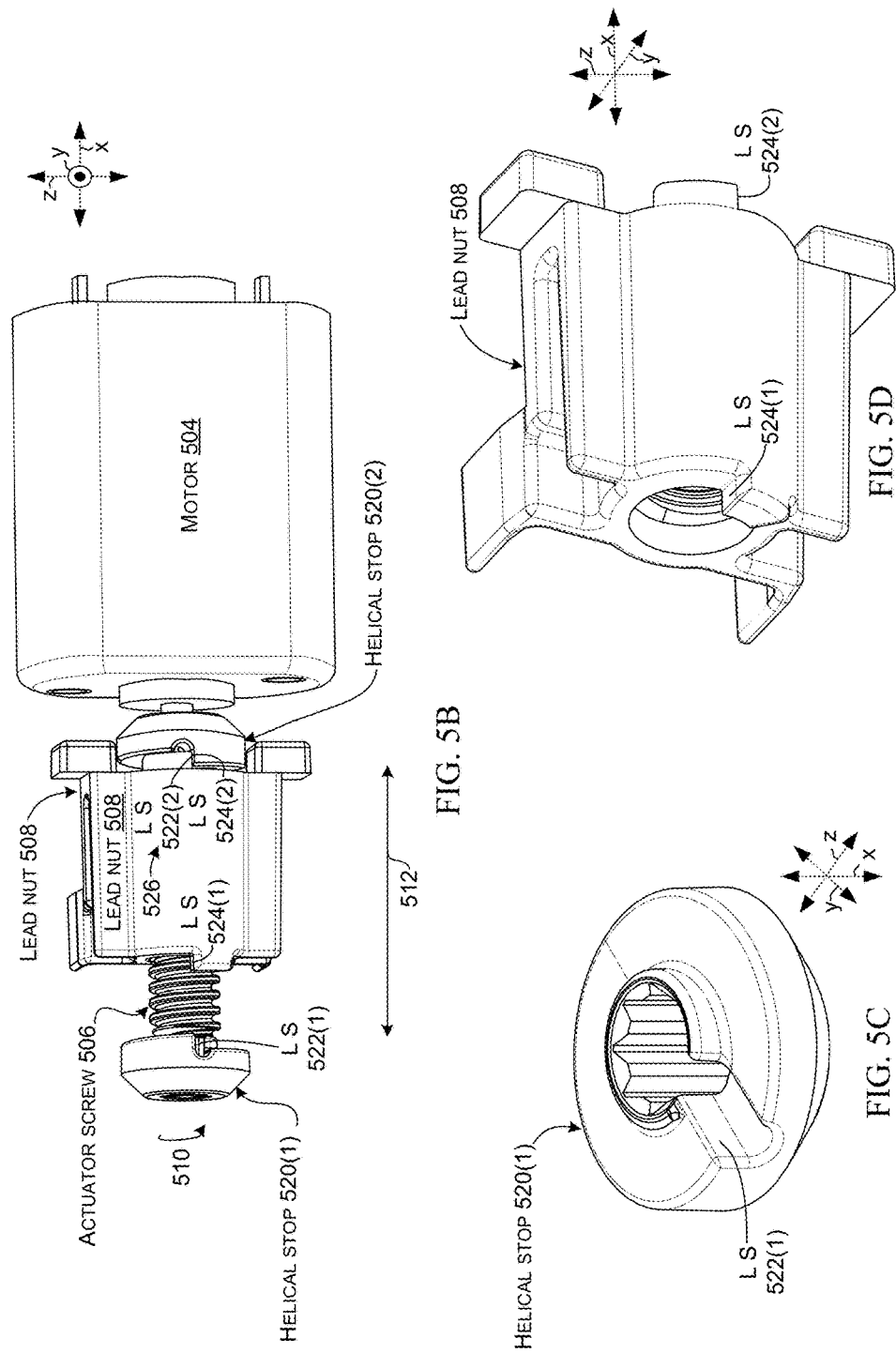

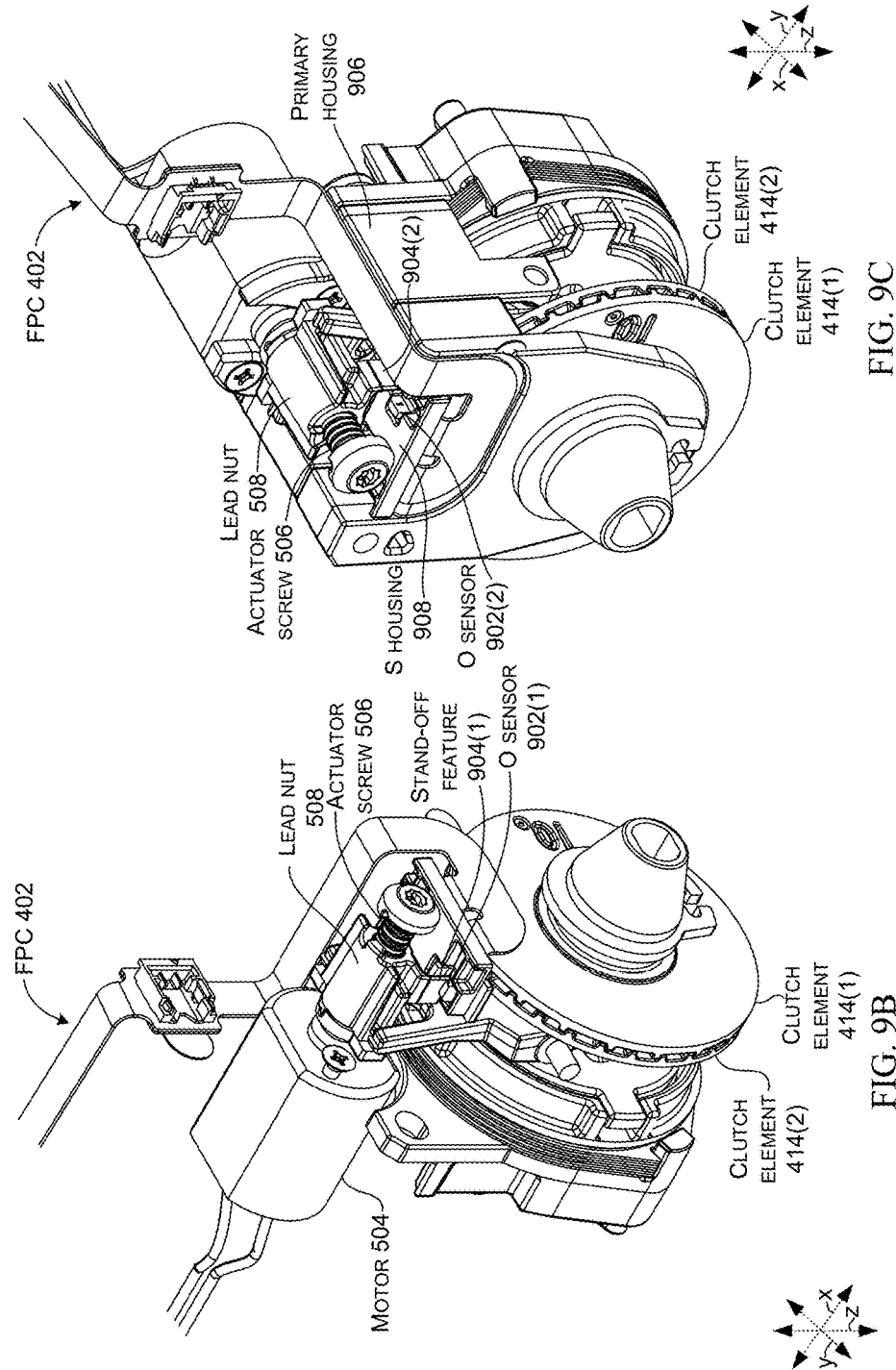

HINGE CLUTCH

PRIORITY

This patent claims priority from U.S. Provisional Application 62/357,880, filed Jul. 1, 2016, which is hereby incorporated in its entirety.

BACKGROUND

The description relates to devices and specifically to hinged devices that employ a clutch to lock and unlock the hinge.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the FIG. and associated discussion where the reference number is first introduced.

FIGS. 1A-1B, 2A-2D, 3A, 4D, 4E, 5A, 5B, 6, and 7C are elevational views of example devices in accordance with the present concepts.

FIGS. 3B, 4A, 4B, 5C, 5D and 9A-9C are perspective views of example devices in accordance with the present concepts.

DESCRIPTION

The present concepts relate to devices, such as computing devices that can include first and second hinged device portions that can be rotated relative to one another. A hinge can rotatably couple the first and second device portions around an axis. A clutch system can be positioned relative to the axis and can include a clutch for locking the portions relative to one another or allowing rotation.

Introductory FIGS. 1A-1B and 2A-2D show example devices which can implement clutch systems.

Figure 1A:
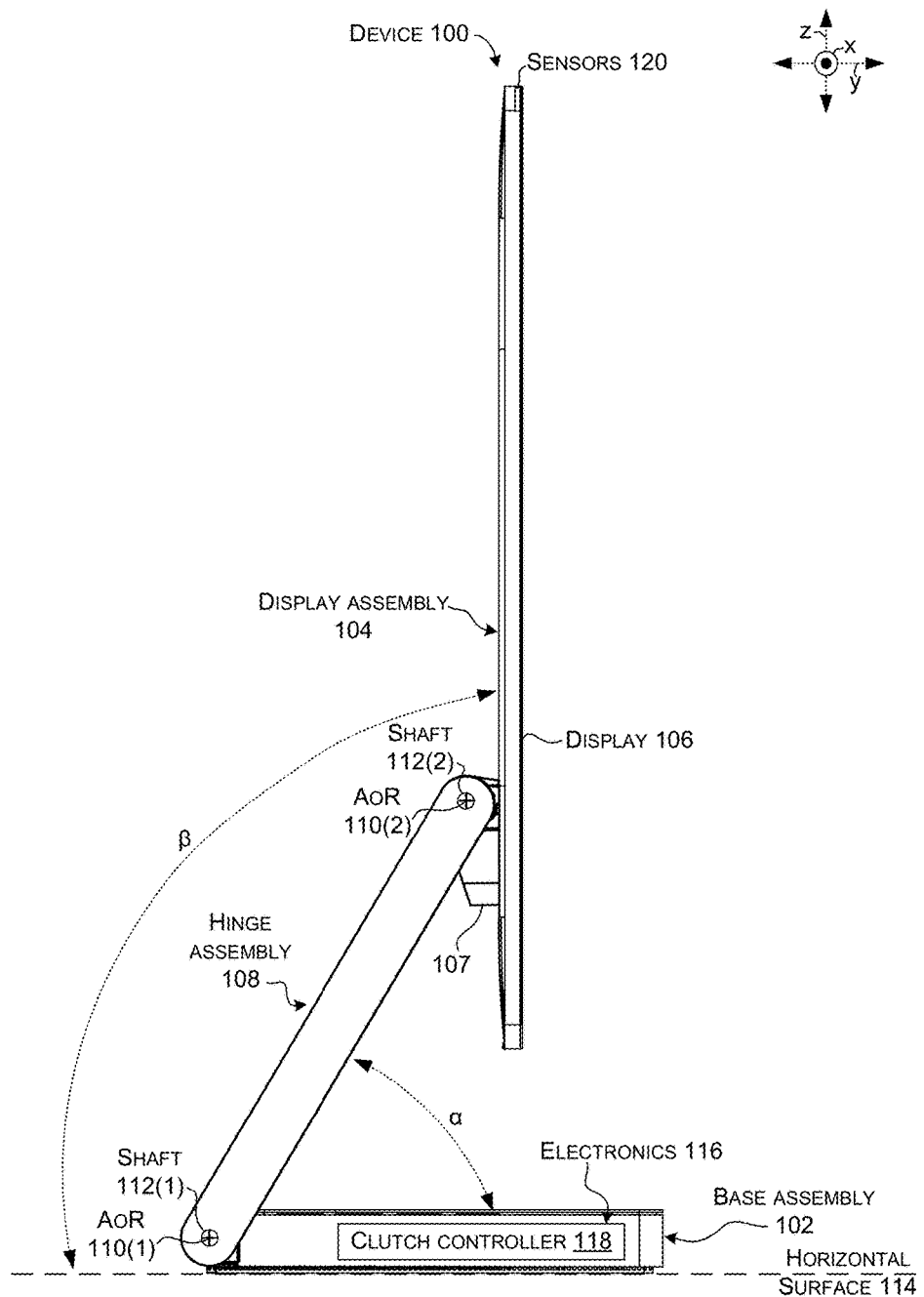
Figure 1B:
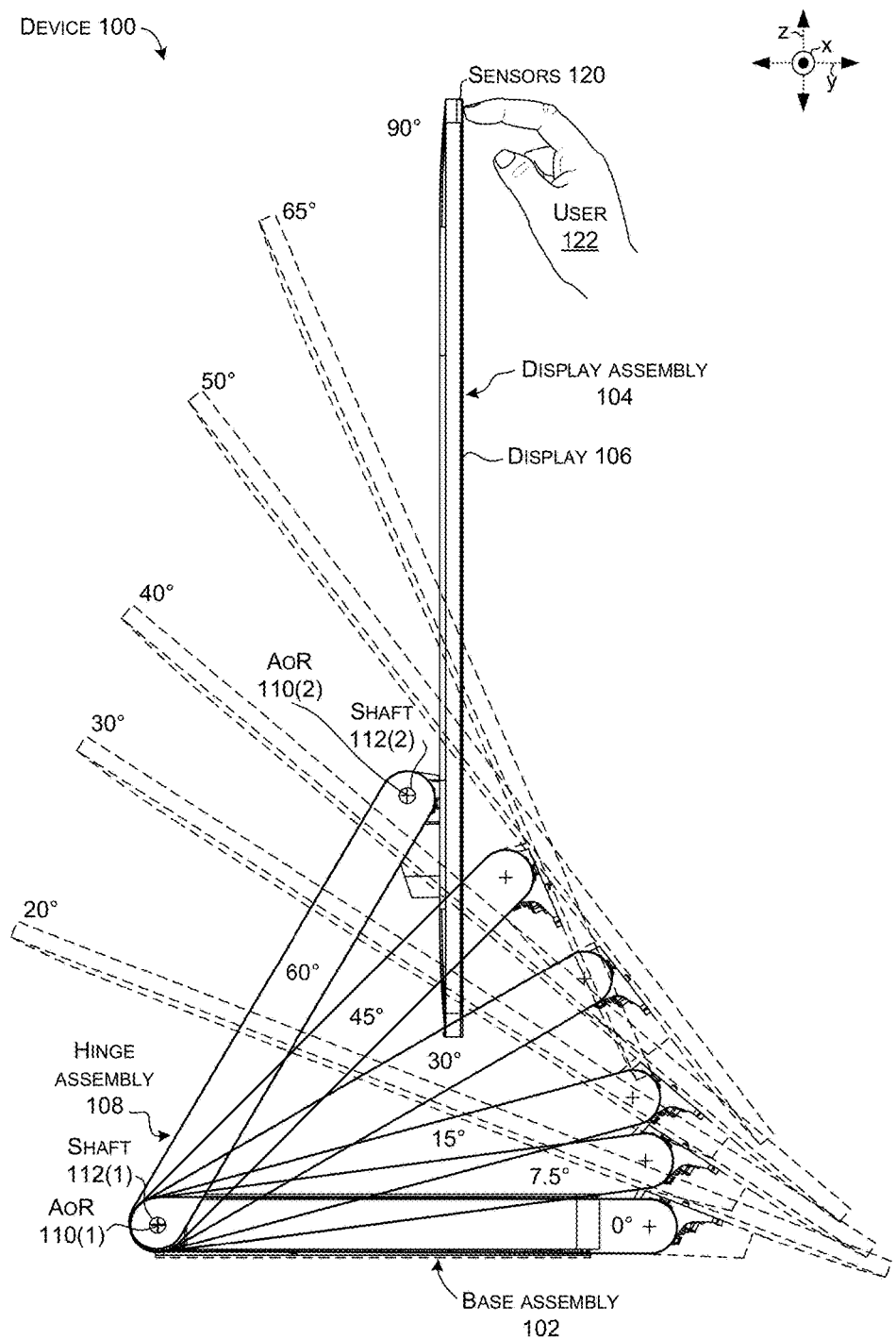

FIGS. 1A and 1B collectively show device 100 that can include a first portion in the form of a base assembly 102 and a second portion in the form of a display assembly 104 that can include a display 106 secured to a display mount 107. A hinge assembly 108 can rotatably couple the first and second portions around an axis of rotation (e.g., "axis") 110 defined by a shaft 112 (e.g., the axis is coextensive with the shaft). In this case, the hinge assembly includes two axes of rotation 110(1) and 110(2) associated with shafts 112(1) (e.g., base shaft) and 112(2) (e.g., display shaft). Other hinge assembly implementations may include a single axis of rotation. Still other hinge assembly implementations may include three or more axes of rotation.

In the illustrated implementation, rotation around the first axis of rotation 110(1) can define an angle alpha or 'α' between the hinge assembly 108 and the base assembly 102 (e.g., between the hinge arm and a horizontal surface 114 upon which the device is positioned). Rotation around hinge axes 110(1) and 110(2) can define an angle beta or 'β' between the display assembly 104 and the horizontal surface 114. The device can also include various electronics 116, such as a clutch controller 118. The clutch controller 118 can be manifest as a general purpose processor, microcontroller, application specific integrated circuit (ASIC), system on a chip (SoC), etc. Electronic components 116 are illustrated in the base assembly 102 and can alternatively or additionally be positioned in other locations, such as the hinge assembly 108 and/or the display assembly 104.

The clutch controller 118 can receive signals from a user control sensor 120. The user control sensor 120 can detect that the user wants to reposition the display 106. For instance, the user control sensor can detect that a user 122 is touching a portion of the display assembly 104 (and/or with how much force the user is touching the display assembly), has his/her hand proximate to a portion of the display assembly, and/or is performing a gesture or verbal command associated with a desire to reposition the display.

Specific examples of electronics 116 are described above. Other examples of electronics 116 can include storage, memory, buses, etc. The term "device," "computer," or "computing device" as used herein can mean any type of device that has some amount of processing capability and/or storage capability. Processing capability can be provided by one or more processors that can execute data in the form of computer-readable instructions to provide a functionality. Data, such as computer-readable instructions and/or user-related data, can be stored on storage, such as storage that can be internal or external to the computer. The storage can include any one or more of volatile or non-volatile memory, hard drives, flash storage devices, and/or optical storage devices (e.g., CDs, DVDs etc.), remote storage (e.g., cloud-based storage), among others. As used herein, the term "computer-readable media" can include signals. In contrast, the term "computer-readable storage media" excludes signals. Computer-readable storage media includes "computer-readable storage devices." Examples of computer-readable storage devices include volatile storage media, such as RAM, and non-volatile storage media, such as hard drives, optical discs, and flash memory, among others.

As mentioned above, clutch controller 118 can be implemented as a chip (SoC) type design. In such a case, functionality provided by the device can be integrated on a single SoC or multiple coupled SoCs. One or more processors can be configured to coordinate with shared resources, such as memory, storage, etc., and/or one or more dedicated resources, such as hardware blocks configured to perform certain specific functionality. Thus, the term "processor" as used herein can also refer to central processing units (CPUs), graphical processing units (GPUs), controllers, microcontrollers, processor cores, or other types of processing devices.

Generally, any of the functions described herein, such as clutch control can be implemented using software, firmware, hardware (e.g., fixed-logic circuitry), or a combination of these implementations. The term "component" as used herein generally represents software, firmware, hardware, whole devices or networks, or a combination thereof. In the case of a software implementation, for instance, "component" may represent program code that performs specified tasks when executed on a processor (e.g., CPU or CPUs). The program code can be stored in one or more computer-readable memory devices, such as computer-readable storage media. The features and techniques of the component are platform-independent, meaning that they may be implemented on a variety of commercial computing platforms having a variety of processing configurations.

Some SoC configurations can employ an application specific integrated circuit (ASIC). For example, the ASIC can include logic gates and memory or may be a microprocessor executing instructions to accomplish the functionality associated with the clutch controller.

FIGS. 2A-2D show another example device 100A. (The suffix 'A' is used on device 100A to convey that components of this device may be the same and/or different from those of device 100 of FIGS. 1A-1B. To avoid clutter on the drawing page the 'A' suffix is not carried through to individual components). In this implementation, user control sensor 120 can detect when the user 122 grasps the side of the display 106 (or other part of the display assembly 104). The user control sensor 120 can send a signal to the clutch controller 118. The clutch controller can allow rotation around either or both of the axes of rotation 110(1) and/or 110(2) associated with hinge assembly 108. When the user releases the side of the display, the user control sensor can stop sending the signal and the clutch controller can smoothly lock rotation around the axes of rotation (e.g., lock the relative positions of the base assembly 102, hinge assembly 108, and/or display assembly 104).

Figure 3A:
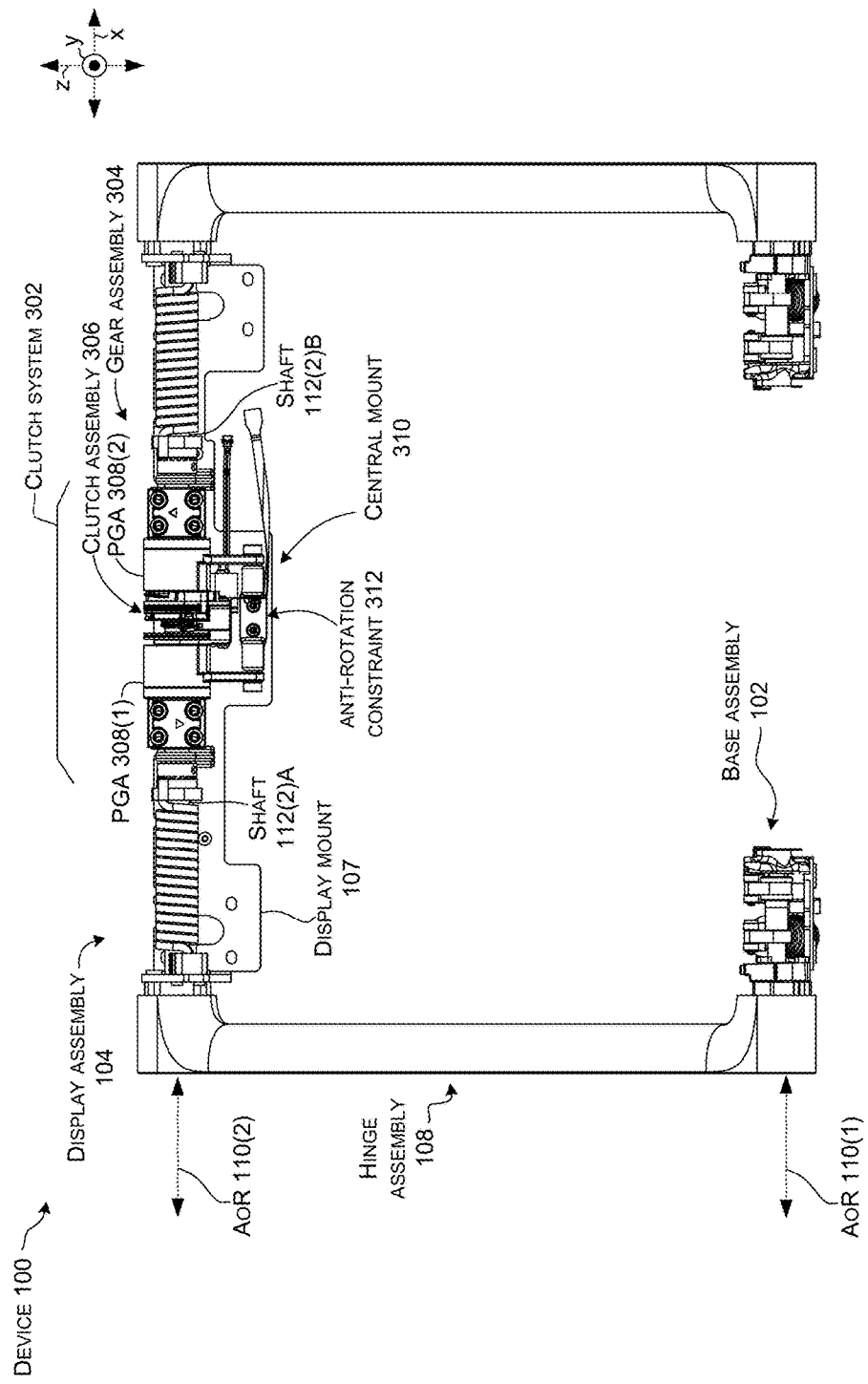
Figure 3B:
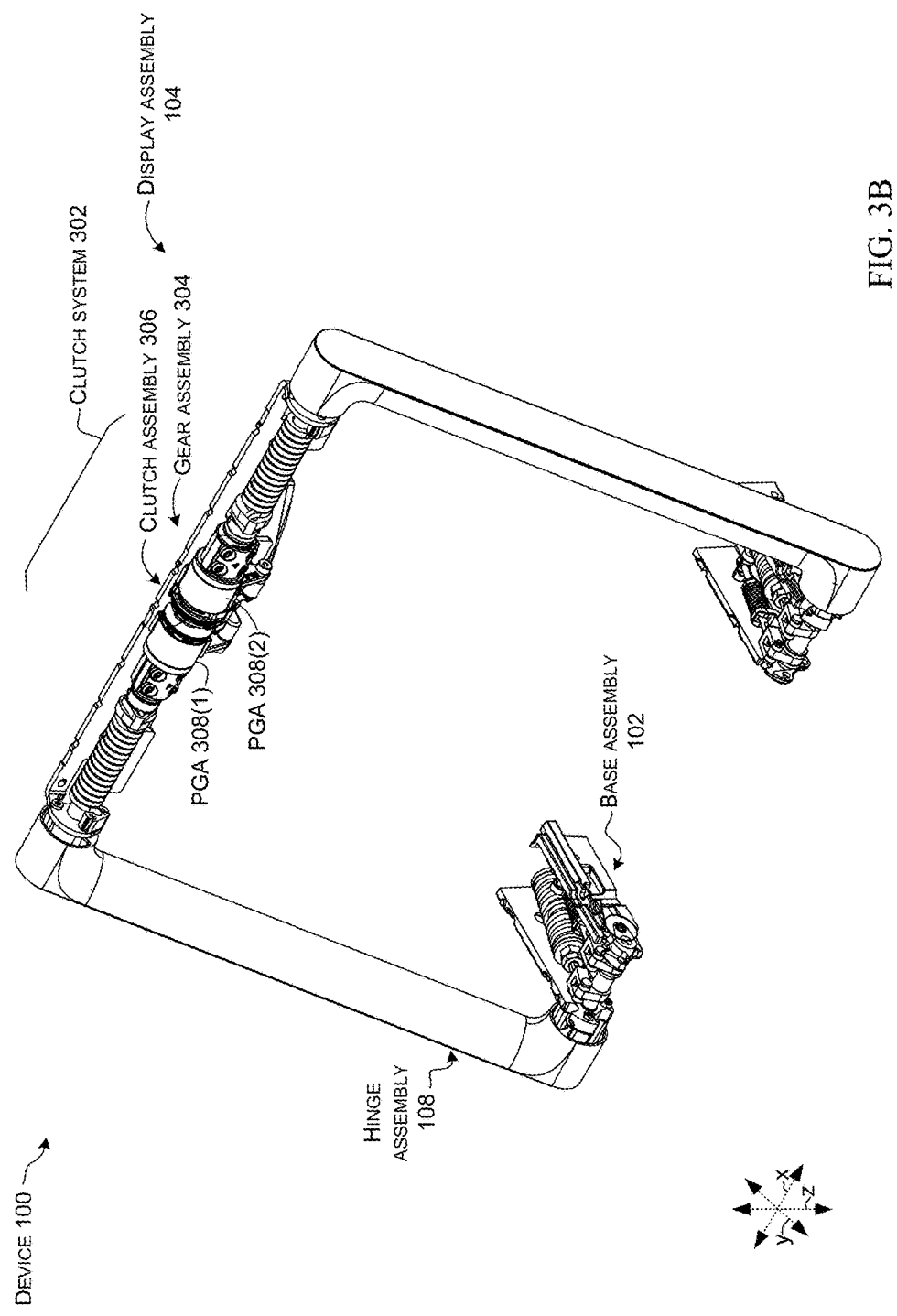

FIGS. 3A and 3B show additional views of device 100 with the display removed from the display mount 107 to allow more of the display assembly 104 and/or hinge assembly 108 to be visualized. The display assembly 104 and/or the hinge assembly 108 can include a clutch system 302 that can include a gear assembly 304 and a clutch assembly 306. In this case, the gear assembly 304 is manifest as first and second planet gear assemblies 308. In this case, the clutch assembly 306 is interposed between the first and second planet gear assemblies 308(1) and 308(2). This interposed orientation can allow a single clutch assembly to control two gear assemblies. The clutch system 302 can be fastened to the shafts 112(2). The clutch system can also be fastened to the display mount 107, such as via a common or shared central mount 310, such as an anti-rotation constraint 312. Other implementations can utilize other mounting elements.

Figure 2A:
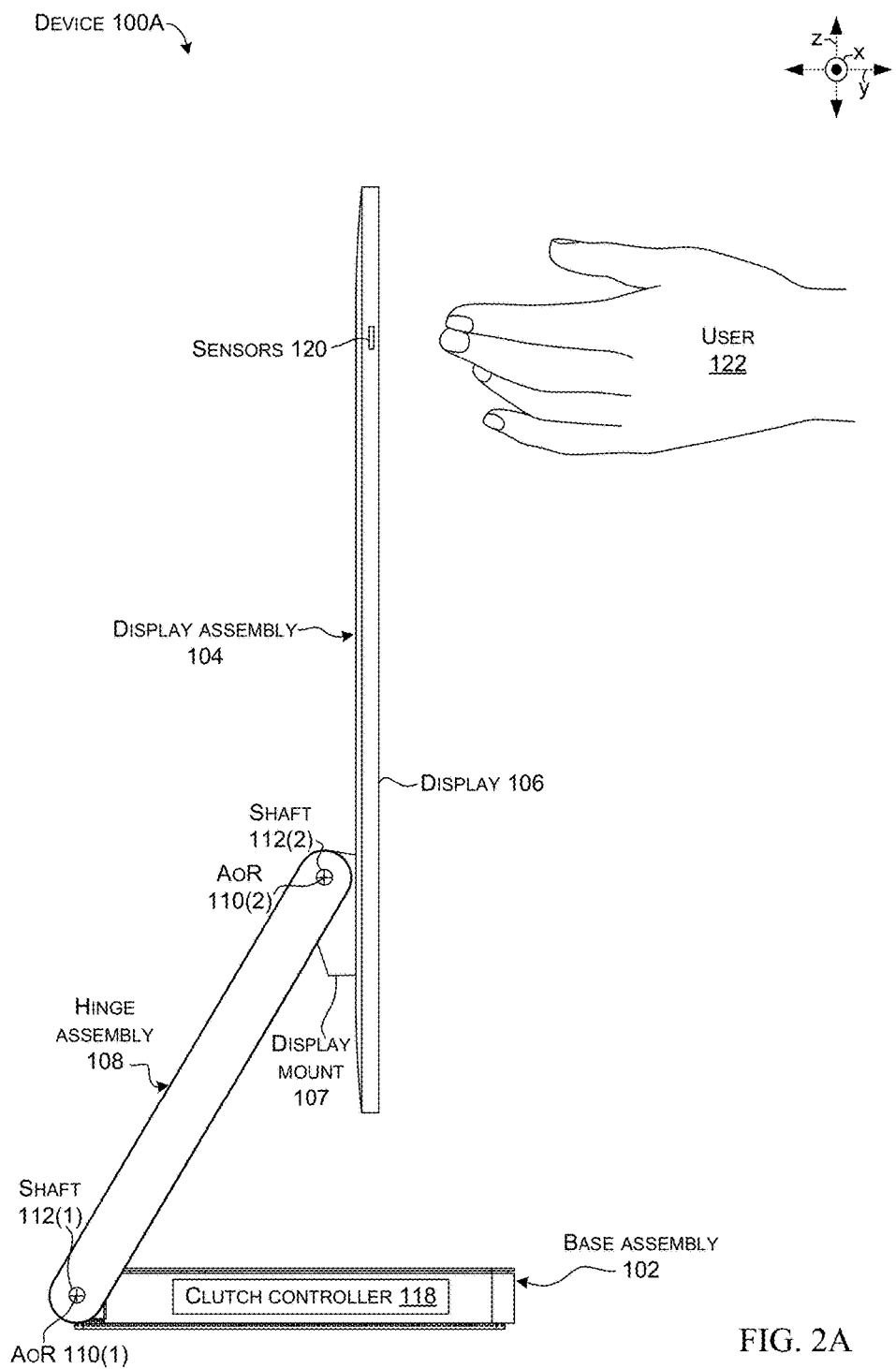
Figure 2B:
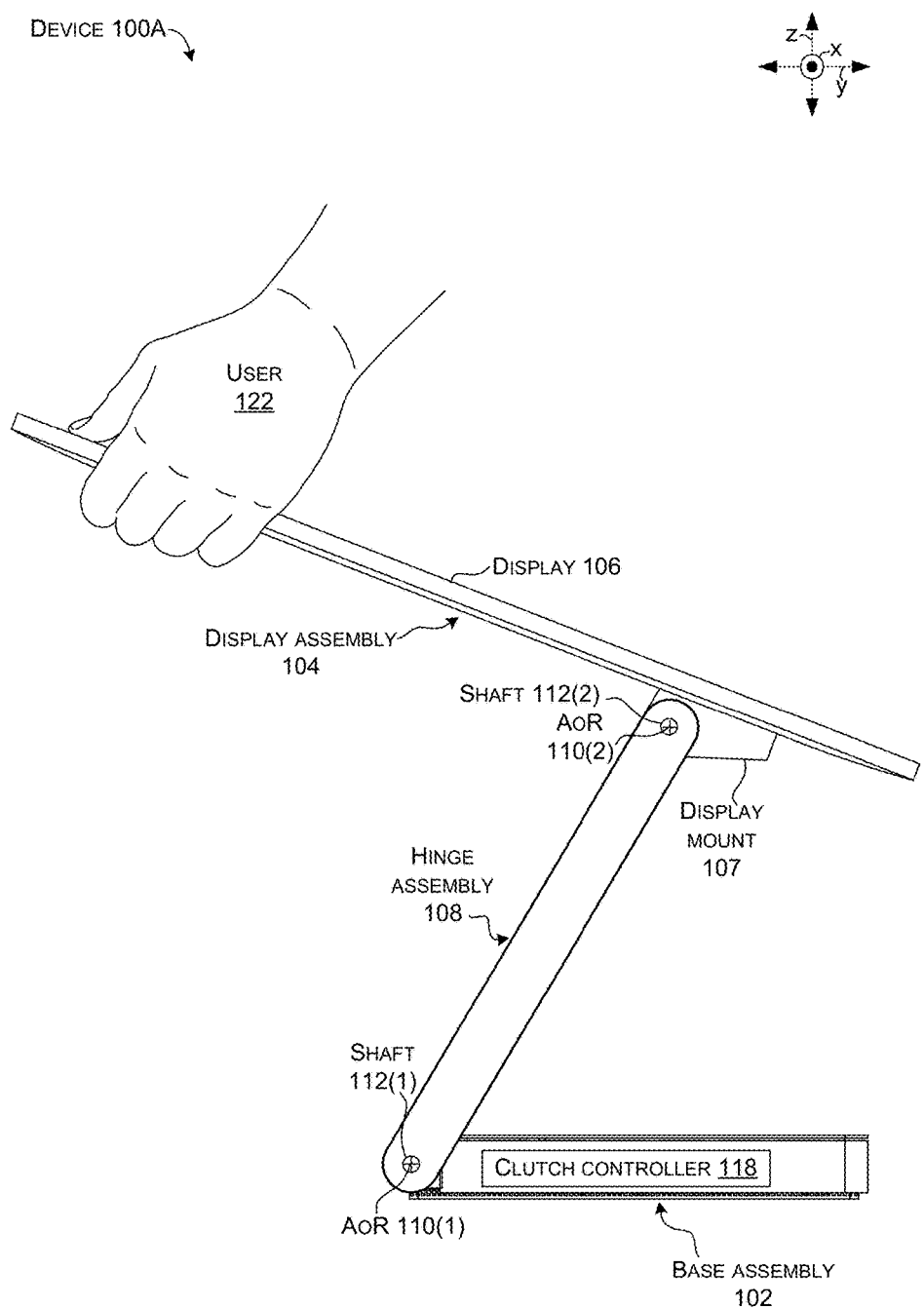
Figure 2C:
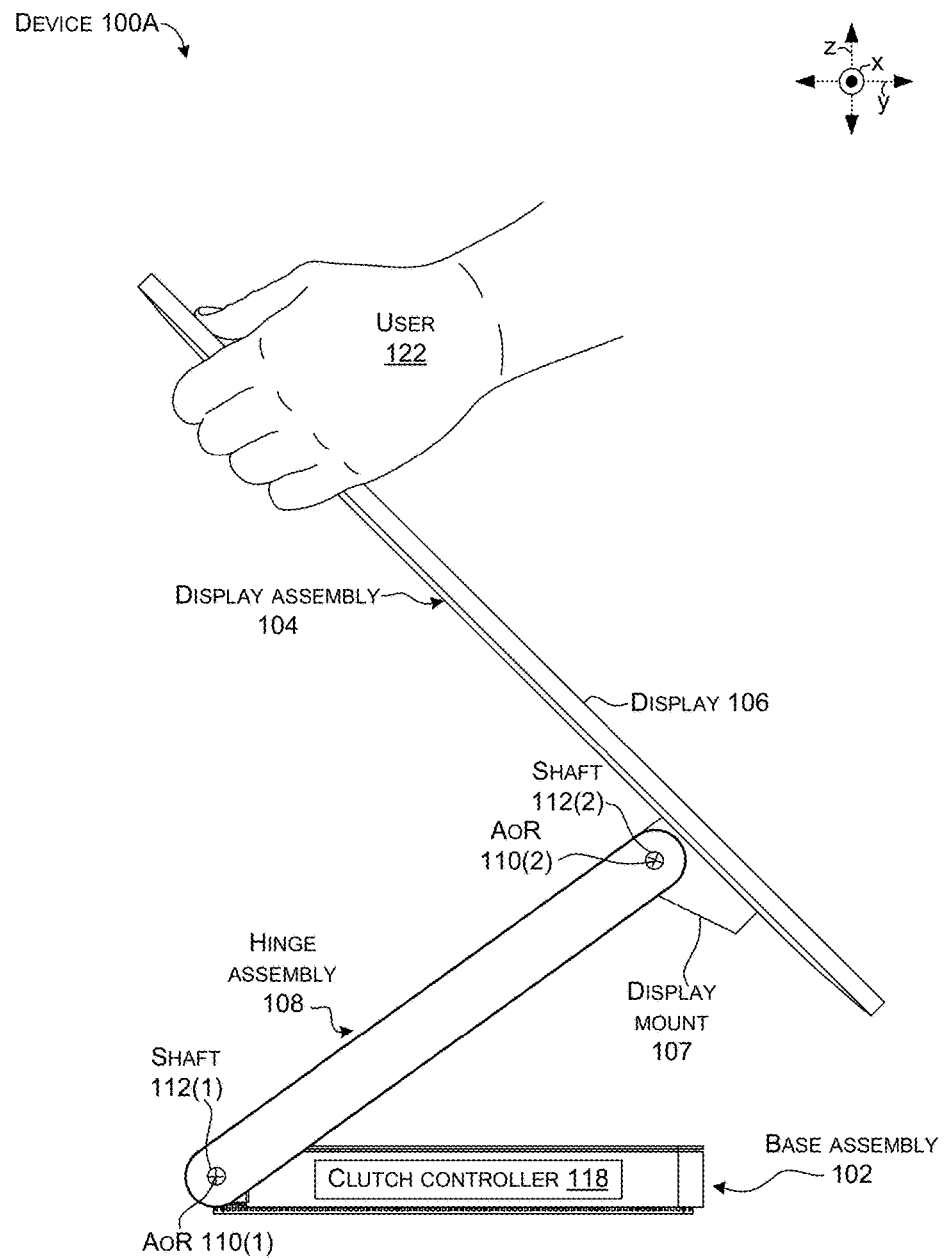
Figure 2D:
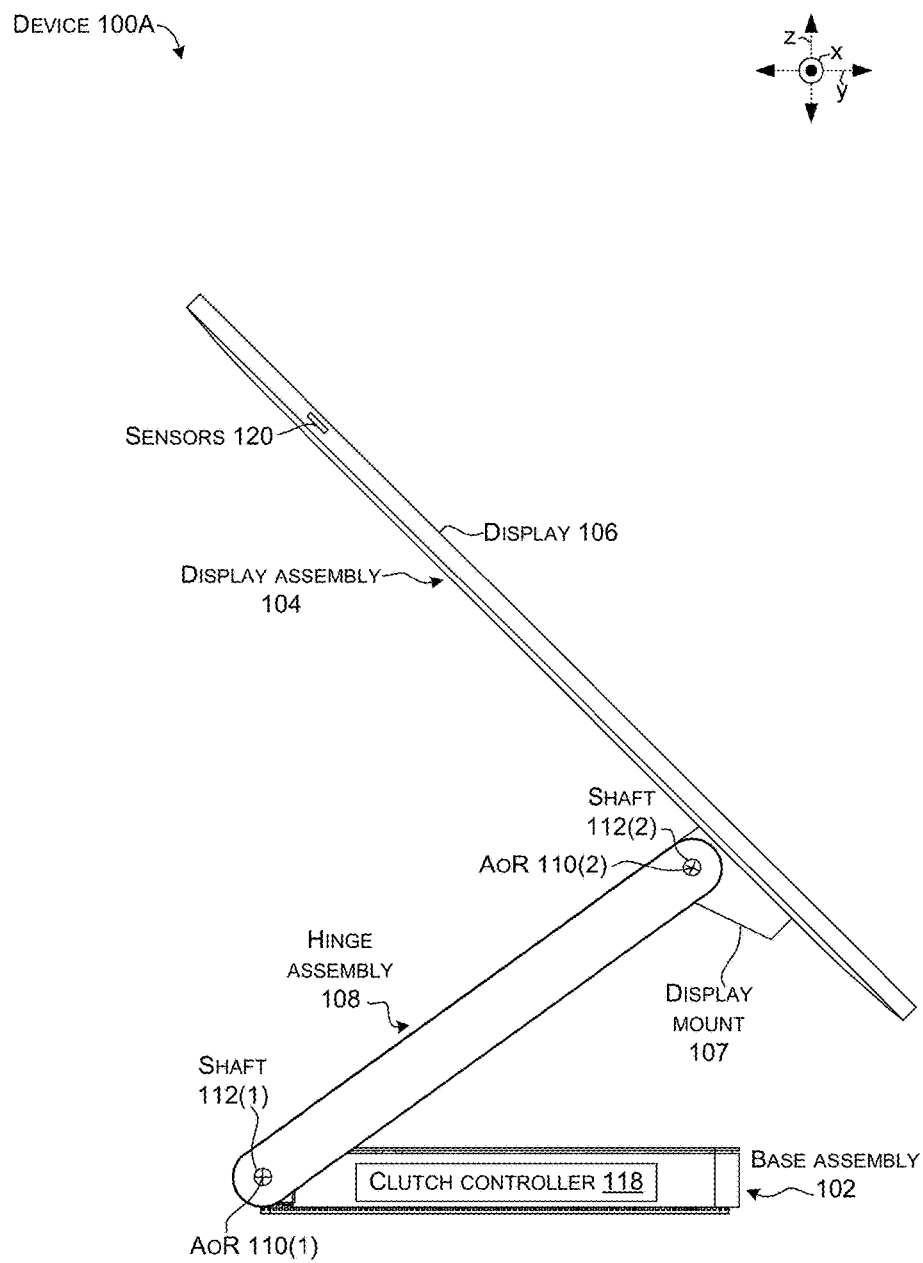

The clutch system 302 can be configured to transition between a rotatable position to allow the display 106 to rotate around the axis 110(2) (see FIGS. 2B and 2C) and a locked position that locks rotation of the display (see FIGS. 2B and 2C). For instance, the locked position can lock rotation of the display mount 107 relative to shafts 112(2)A and 112(2)B.

Figure 4A:
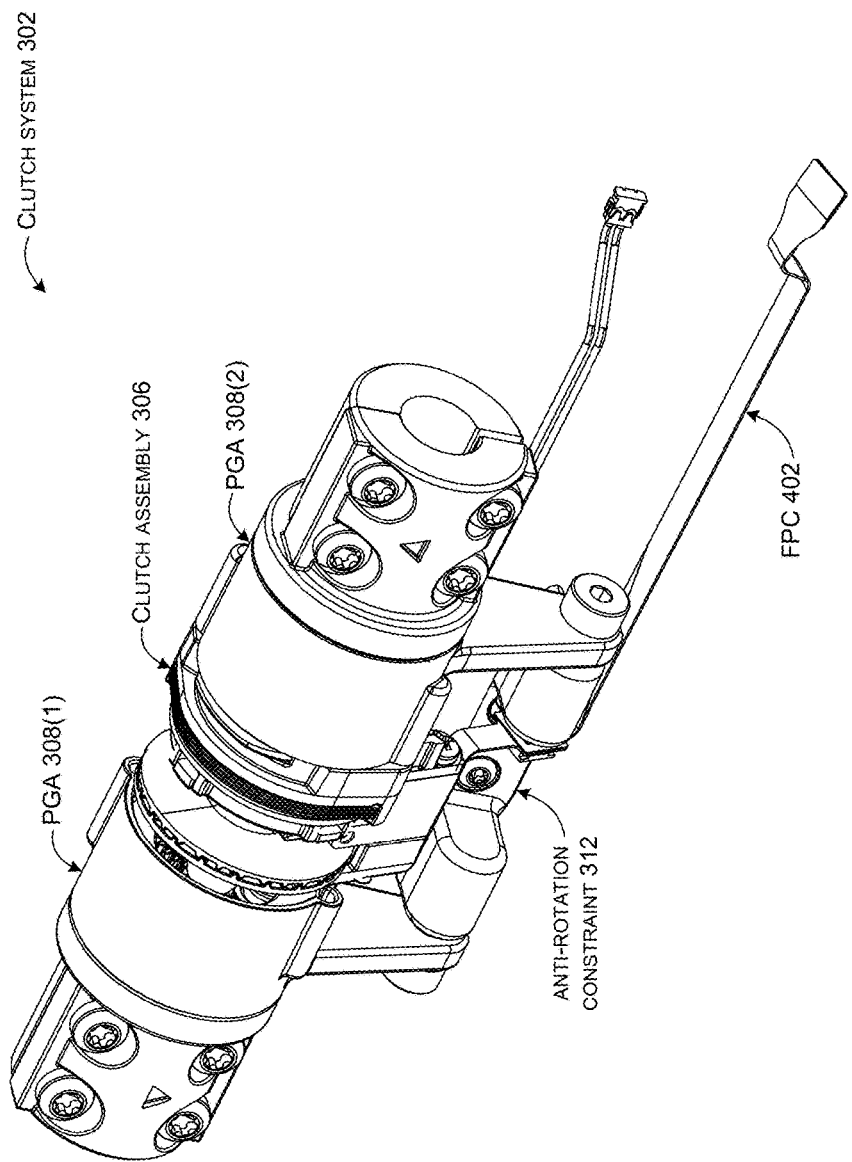
Figure 4B:
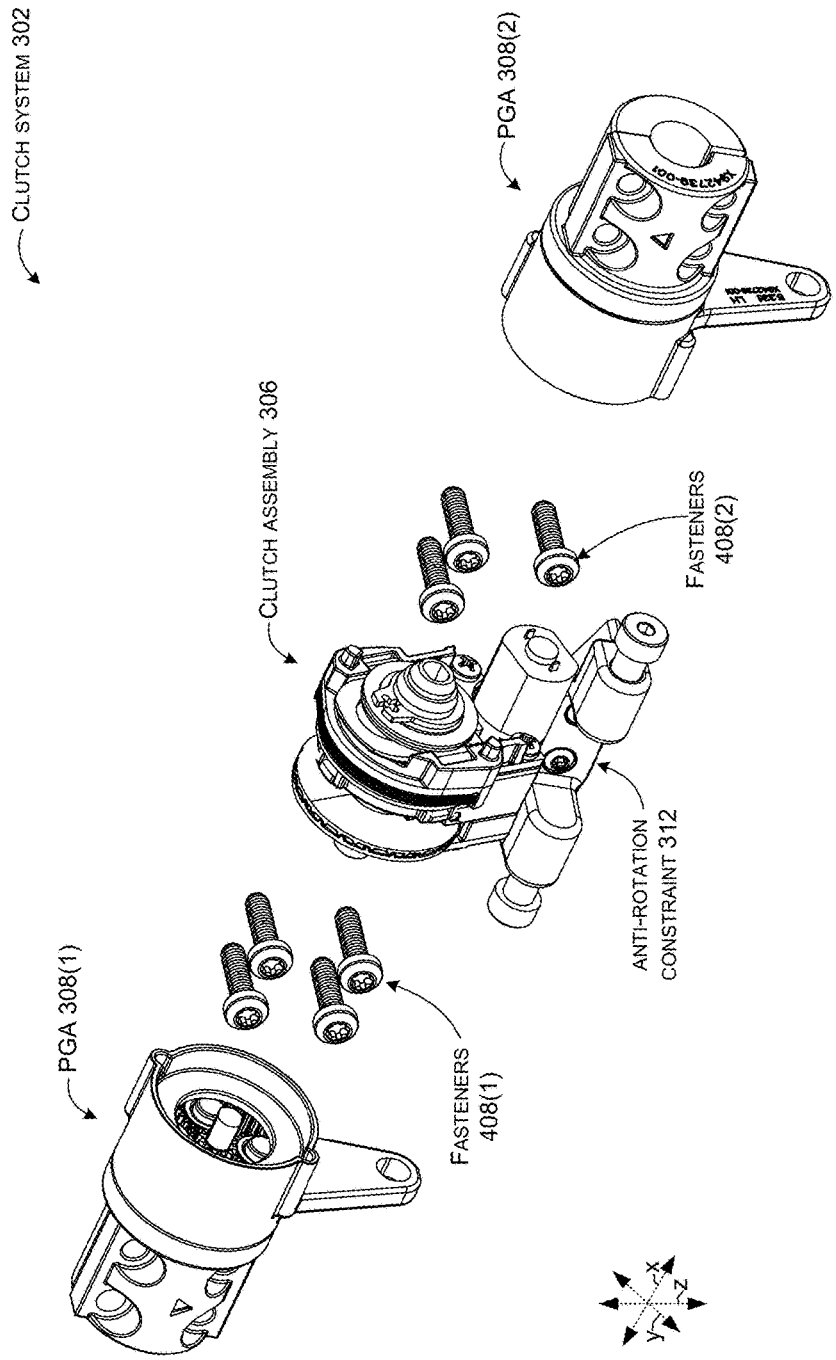
Figure 4C:
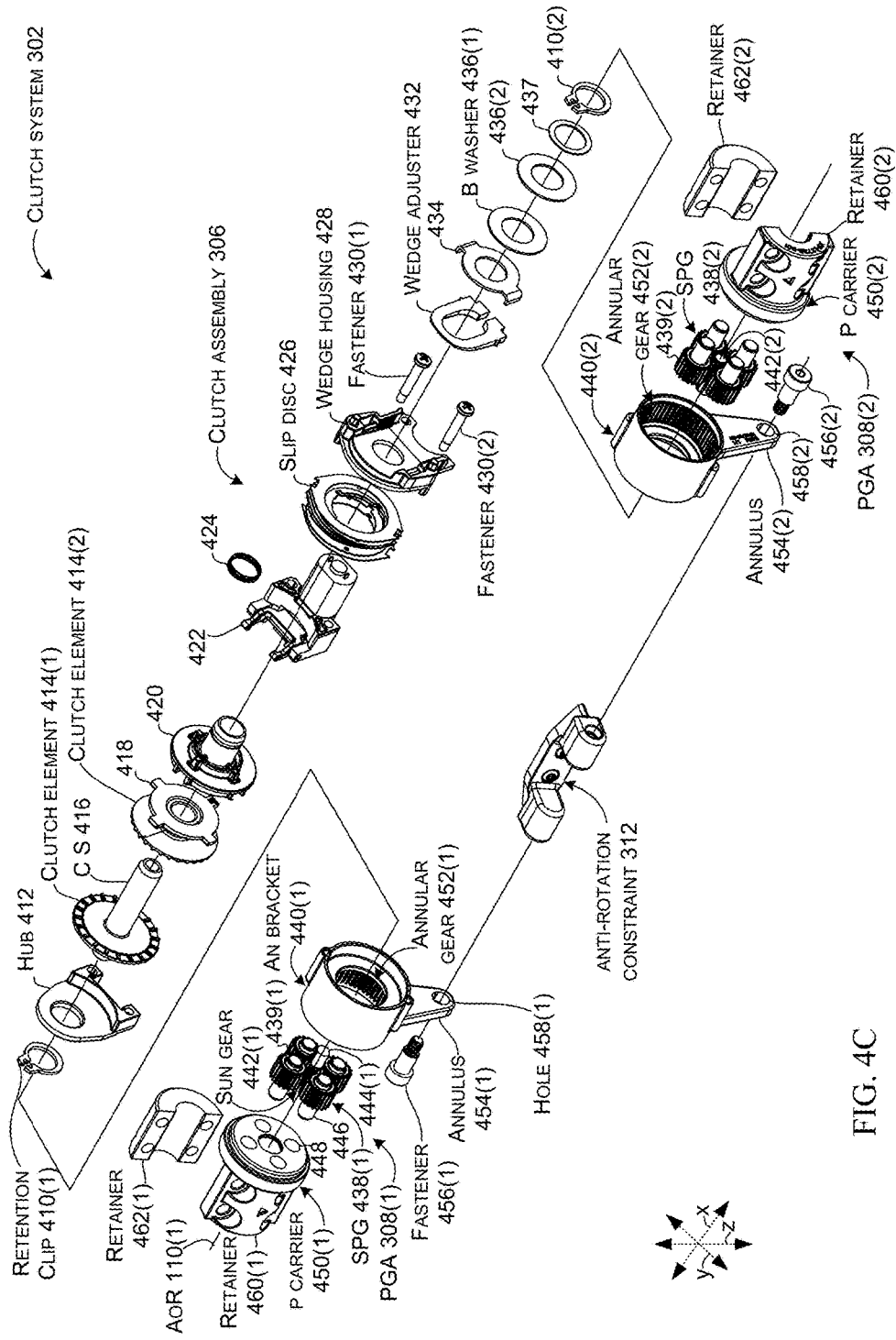
FIG. 4C is an exploded perspective view of an example device in accordance with the present concepts.

FIGS. 4A-4C show additional details of clutch system 302. FIG. 4A shows a close-up of clutch system 302, anti-rotation constraint 312, and introduces flexible printed circuit (FPC) 402. FIG. 4B shows the clutch system exploded into planet gear assemblies 308(1) and 308(2) and clutch assembly 306. Fasteners 408(1) can secure planet gear assembly 308(1) to shaft (112(2)A, FIG. 3A) and fasteners 408(2) can secure planet gear assembly 308(2) to shaft (112(2)B, FIG. 3A). FIG. 4C shows an exploded view of the planet gear assemblies 308(1) and 308(2) and clutch assembly 306.

As can be evidenced from FIG. 4C, this example clutch assembly 306 can include retaining elements, such as retaining clips 410(1) and 410(2). The retaining clips can define a length of the clutch assembly (as measured parallel to the x reference axis). Positioned between the retaining clips can be a hub 412 and first and second clutch elements 414(1) and 414(2). In this case, clutch element 414(1) can be fixed to a clutch shaft 416 and clutch element 414(2) can be rotatably positioned on the clutch shaft 416. As will be explained below, in this example, the clutch shaft 416 is co-extensive with shafts 112(2) of FIG. 3A. In other implementations, the clutch shaft can be offset or off-axis from the shaft(s) (e.g., from the axis/axes of rotation). Stated another way, the clutch can operate along a shaft that is parallel to, but not co-extensive with the shaft(s) defining the axis of rotation. Gear(s) on the shaft can be locked and unlocked by the clutch through intervening gears, belts, and/or chains to control rotation around the axis.

The clutch assembly 306 can also include a rotation lock 418, a slip endplate 420, clutch lever 422, a clutch spring 424, slip elements, such as slip disc(s) 426, a wedge housing 428, fasteners 430, and an adjustable wedge adjuster 432. The clutch assembly can also include a wedge plate 434, conical spring washers (e.g., Belleville washers) 436, and washer 437. The adjustable wedge adjuster 432 can be adjusted in the wedge housing 428 orthogonally to the axis of rotation 110(2) to control force between retention clips 410(2) and slip endplate 420 along the axis of rotation.

In this example planet gear assemblies 308 can include a set of planet gears 438 (in this case the set of planet gears includes four gears 439). The set of planet gear assemblies 308 can also include an annulus bracket 440. The planet gears are rotatably fixed to planet carriers 450 by the planet carrier shafts 446. The set of planet gears 438 can travel around a sun gear 442. The sun gears 442 are partially obstructed by the associated set of planet gears 438 and are more readily visualized relative to FIG. 7A. The sun gears 442 can be secured to keys 444 that can be received by each end of clutch shaft 416. Thus, the sun gear can, in essence, function as geared ends of the clutch shaft. The set of planet gears 438 can rotate around planet carrier shafts 446 that can be received in holes 448 formed in planet carriers 450. The planet gears 439 can be rotatably fixed to the planet carriers 450 by the planet shafts 446.

The annulus brackets 440 can include annular gears 452. The annulus brackets 440 can be secured to anti-rotation constraint 312 via fasteners 456 through holes 458. The annulus brackets 440 can be rotatably secured to planet carriers 450 such that the planet gears 439 rotate between the sun gears 442 and the annular gears 452. The planet carriers 450 can be configured to be secured to shaft (112(2), FIG. 3A, e.g., planet carrier 450(1) can be secured to shaft 112(2)A and planet carrier 450(2) can be secured to shaft 112(2)B). In this case planet carriers 450 are secured to first split retainers 460 that are secured to second split retainers 462 by fasteners (408, FIG. 4B) to lock the planet carriers in fixed relation to the shaft (112(2), FIG. 3A). Stated another way, the annulus brackets can be fixed from rotation, but the planet carriers can be free to rotate, that is fixed to shaft 112.

Various wedge adjuster configurations can be employed. In some cases, the wedge adjuster 432 can have an open end and a closed end, such as in a horseshoe shape configuration as illustrated. The position of the wedge adjuster 432 in the wedge housing 428 can be adjusted to establish specified clamping forces and resulting slip loads for an individual device. The wedge adjuster 432 can provide adjustable compression of the Belleville spring washers 436, which can increase the axial load applied to the slip disks 426. Wedge adjuster profiles are discussed below that explain how the position of the wedge adjuster can change the compressive forces between retention clip 410(2) and slip endplate 420.

FIGS. 4D and 4E show two example profiles for the wedge adjuster 432 introduced above. The wedge adjuster 432A can have a tapered profile of varying thickness (e.g., gradually increasing thickness T from one end to the other.) Wedge adjuster 432B has a stepped profile where the thickness T increases in discreet amounts from one end to the other (e.g., stepped thickness).

In one assembly technique, the wedge adjuster 432 can initially be installed at a low thickness (e.g., low pressure) setting. A torque at which the slip discs 426 slip can be measured and the position of the wedge adjuster can be adjusted (e.g., moved orthogonally) to the x reference axis so that a thicker portion of the wedge adjuster increases compression of the slip discs and thereby resistance to rotation between the slip discs. The torque at which the slip discs slip can be measured and the process can be repeated until a specified slip torque is reached. This torque adjustment via the wedge adjuster 432 can be achieved without disassembly or special tools. Further, at least relative to the stepped wedge adjuster 432B, a guide can be provided for technicians to easily adjust the wedge adjuster. For instance, the guide might specify that if the torque is 'x' then move the wedge adjuster two clicks toward the thicker end, and if torque is 'y' then move the wedge adjuster one click toward the thicker end. As mentioned, wedge adjuster 432 can be adjusted to increase/decrease slip torque of the slip discs 426. The wedge adjuster can occupy very little real estate on the clutch assembly 306 in the x reference direction, does not require a threaded shaft, can be adjusted without disassembly of the clutch system 302, and/or can be adjusted without special tools.

FIGS. 5A-5D collectively show the clutch system 302 and introduce a driving element 502 for engaging and disengaging clutch elements 414(1) and 414(2). In this example, the driving element 502 can include a motor 504 that can turn an actuator or lead screw 506. A lead nut 508 can travel along the actuator screw based upon corresponding threads on the lead nut and the actuator screw. Specifically, rotation 510 of the actuator screw 506 can move the lead nut 508 along an extent of translation 512.

A first end of a clutch lever 422 engages the lead nut 508. The clutch lever 422 pivots at a fulcrum 516 so that a second end moves in an opposite direction to the first end. The second end can force clutch element 414(2) away from clutch element 414(1) (in the +x reference direction) by overcoming a bias created by spring 424 that biases clutch element 414(2) in the −x reference direction. Stated another way, the lead nut 508 can force the first or lower end of the clutch lever 422 to the left. As the clutch lever 422 pivots around fulcrum 516, the second end can force (e.g., pull) clutch element 414(2) away from clutch element 414(1). When the motor reverses direction and the lead nut moves to the right, the compression spring 424 can bias the clutch elements 414 back together (e.g., lock the clutch).

This example clutch system 302 employs a DC motor 504 for driving the clutch elements 414. Other implementations can employ an AC motor, Nitinol Shape Memory Alloy wire, and/or piezoelectric actuators, among others. As mentioned above, the clutch system 302 can be maintained in the locked (non-rotating) state by clutch elements 414 which in this implementation are manifest as inter-meshed toothed disks. Compression spring (C S) 424 can provide the axial force to press the toothed disks together. The motor 504 can supply force to overcome the spring bias in order to separate the clutch elements 414 and unlock the clutch system 302.

Clutch system 302 can also include a position tracking element for tracking clutch location, such as a location of the actuator screw 506 and/or the lead nut 508. In some implementations, the position tracking element can be manifest as sensors and/or physical stops, such as helical stops 520. In some implementations the sensors can be manifest as optical sensors. (An example of optical sensors is discussed below relative to FIGS. 9A-9C. The optical sensors are removed in the view of FIG. 5A to allow underlying elements to be visualized). The sensors can solely, or in combination with the stops, provide positional information for controlling the motor 504. For instance, the helical stops 520(1) and 520(2) can be positioned at opposing ends of the actuator screw 506. The helical stops, when engaged by the lead nut 508, can increase load on the motor 504. As can be appreciated from FIGS. 5B-5D, in this implementation, the helical stops include limiting surfaces 522 that correspond to limiting surfaces 524 on the lead nut 508.

The clutch controller (118, FIG. 1A) can use this load as an indication of the position of the lead nut 508. From another perspective, the helical stops 520 can be aligned rotationally, with respect to the lead nut travel timing, such that the limiting surfaces 524 on the lead nut 508 correspond to the limiting surfaces 522 on the helical stops 520 on either end of the actuator screw 506. See the engaged limiting surfaces 522(2) and 524(2) as indicated generally at 526.

A purpose of the helical stops' limiting surfaces 522 is for the lead nut 508 to reach a solid end of travel limit, such that overtravel is not possible. However, if the limiting surfaces were oriented orthogonal to the screw axis, then the lead nut would tend to jam or wedge into the stop due to the small angle of the actuator screw helix. This makes reversal of the actuator screw 506 after engaging the limit difficult. However, if the limiting surfaces engage along a radial plane (a plane oriented along the screw axis in the radial direction), then it is not possible to wedge or jam the screw stops into the nut.

In one implementation, the DC motor 504 can be a Nidec BCA-3626 that is mounted on a primary housing (see FIG. 9C). The actuator screw 506 can be pressed onto the shaft (not specifically shown) of the motor to a known depth. Lead nut 508 can be threaded onto this actuator screw and restrained from rotation by the primary housing (FIG. 9C) and clutch lever 422. With these restraints, the lead nut 508 can only move in the axial direction when the motor shaft rotates actuator screw 506. When the lead nut moves axially, it drives the clutch lever 422 to pivot about the primary housing (e.g., fulcrum 516) and bear onto the driving surface of one of the clutch elements 414. This motion then overcomes the axial force of the spring 424 located in the center of the clutch shaft and separates the clutch elements 414. When the motor 504 reverses direction, the lead nut 508 returns to the locked position state and the spring force returns the clutch elements to the engaged, or locked state. Note that by using spring force to engage the clutch elements and the clutch lever to disengage the clutch elements can reduce the likelihood of device tolerances affecting clutch performance. For example, once the clutch lever disengages the clutch elements, slight variations in how far apart the clutch lever moves them does not affect device function (e.g., the clutch is disengaged). Similarly, once the clutch lever allows the spring to force the clutch elements together, slight variations in how much farther the clutch lever moves do not affect clutch function (e.g., the clutch is engaged).

Figure 5A:
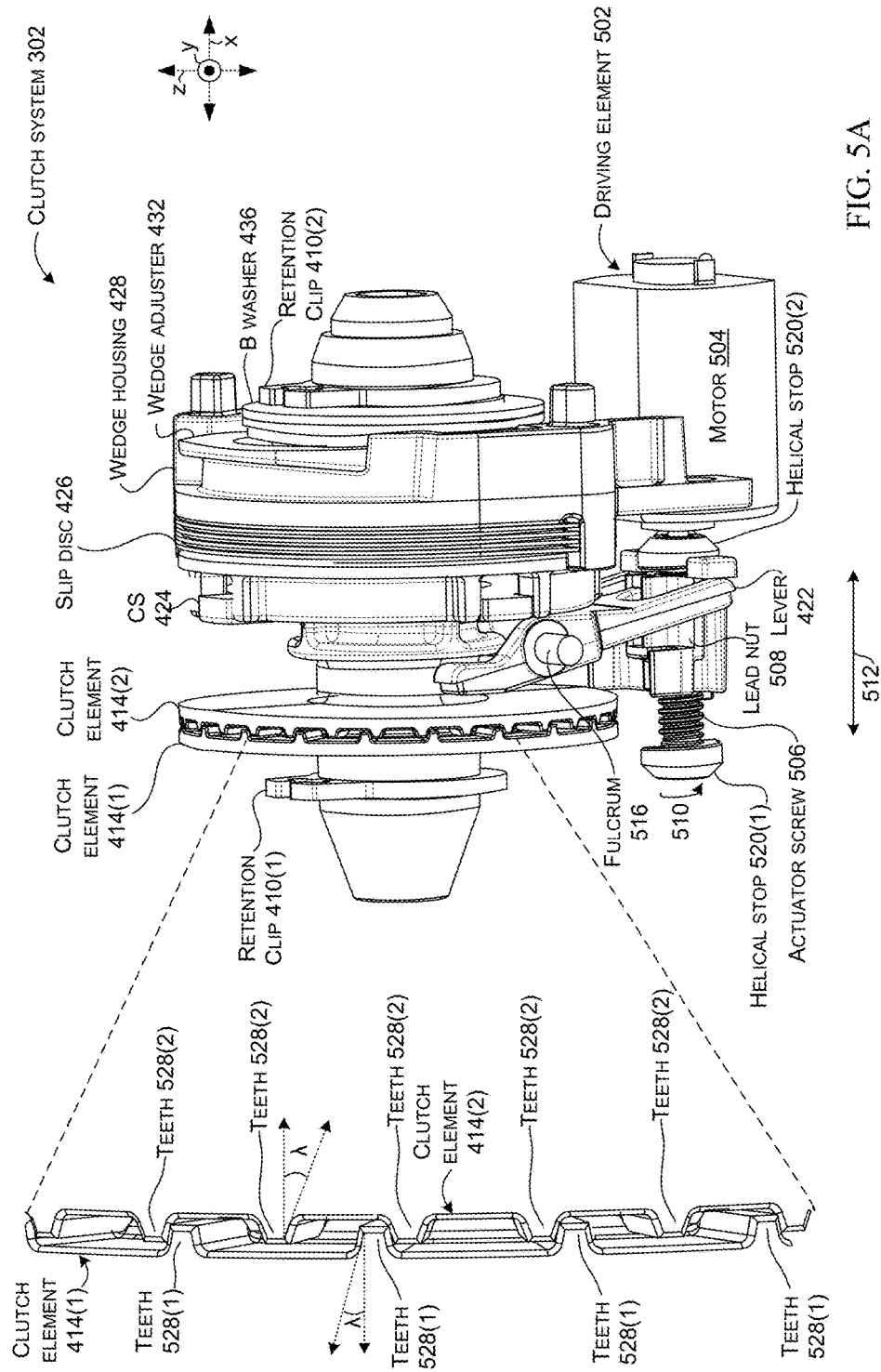

In order to prevent overloading of the clutch elements 414 and cause undesirable modes of failure, a breakaway torque element can be incorporated into the clutch system. In some implementations, the breakaway torque element can be manifest as slip discs 426. Some of the slip discs can be coupled to slip end plate 420 and other slip discs 426 can be coupled to wedge housing 428. At the far right side of FIG. 5A are the two Belleville spring washers 436, wedge adjuster 432, and retention clip 410(2). The Belleville spring washers 436 can supply the clamping forces to prevent rotation of the slip disks at torque levels lower than a desired break away force that is safely less than the breaking force of clutch elements 414. At high torsional loads, the friction is overcome and the slip discs 426 rotate in opposing directions from each other before the clutch elements 414 fail. As mentioned above relative to FIG. 4, the friction between the slip discs can be adjusted via wedge adjuster 432.

Further, as can be appreciated from FIG. 5A, some of the present implementations can employ teeth 528(1) on clutch element 414(1) and teeth 528(2) on clutch element 414(2). The teeth 528 of the two clutch elements can interlock to prevent unintended slippage between the two clutch elements when the clutch is engaged. Further, in some of these implementations the clutch elements 414 can employ an angle lambda λ on their respective engaging surfaces that is not parallel to the clutch shaft 416 (e.g., the x reference axis). Instead, the angle lambda can be in a range from about five degrees to about twenty degrees. These angles can reduce unintended clutch slippage while still allowing clutch disengagement when the clutch is under load. For instance, if a user is pushing down on the display (106, FIG. 1A) and then engages the clutch, the clutch is under a load that can prevent disengagement of clutch teeth that are engaged along surfaces that are parallel to the clutch shaft. The range of angles mentioned above can combine holding force with disengageability.

Further still, the illustrated clutch configuration can provide nearly instantaneous clutch engagement and reduced risk of opposing teeth 528(1) and 528(2) colliding and associated clutch slippage and/or grinding. Toward this end, less teeth can be positioned on the clutch elements 414 than could be accommodated for the tooth width. For example, a clutch element might accommodate twenty four teeth of a given width. However, for instance, only eight teeth are employed and evenly spaced on the clutch element with gaps in between. Thus, upon engagement teeth 528(1) of clutch element 414(1) are less likely to contact teeth 528(2) of clutch element 414(2) and are instead more likely to engage between teeth. Further still, some implementations can employ differing numbers of teeth 528 on each clutch element 414. Continuing with the above example where twenty four teeth can be accommodated, eight evenly spaced teeth 528(1) can be employed on clutch element 414(1) and twelve evenly spaced teeth 528(2) can be employed on clutch element 414(2). In such a configuration, upon clutch engagement the teeth are more likely to encounter a gap upon engagement rather than smashing into an opposing tooth, yet some of the teeth will quickly engage without further relative rotation between the clutch elements (e.g., not all of the teeth are engaging and locking). Of course, the values provided in these examples are provided for purposes of explanation and other values are contemplated.

Figure 6:
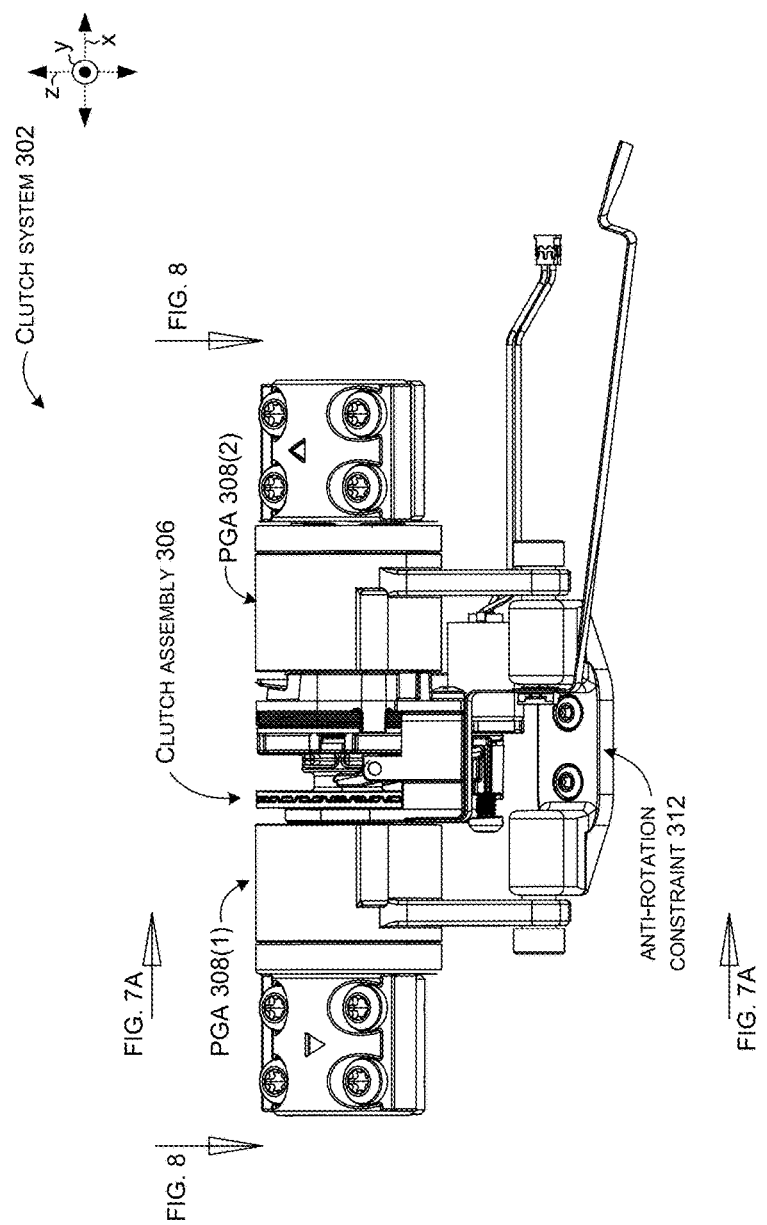
Figure 7A:
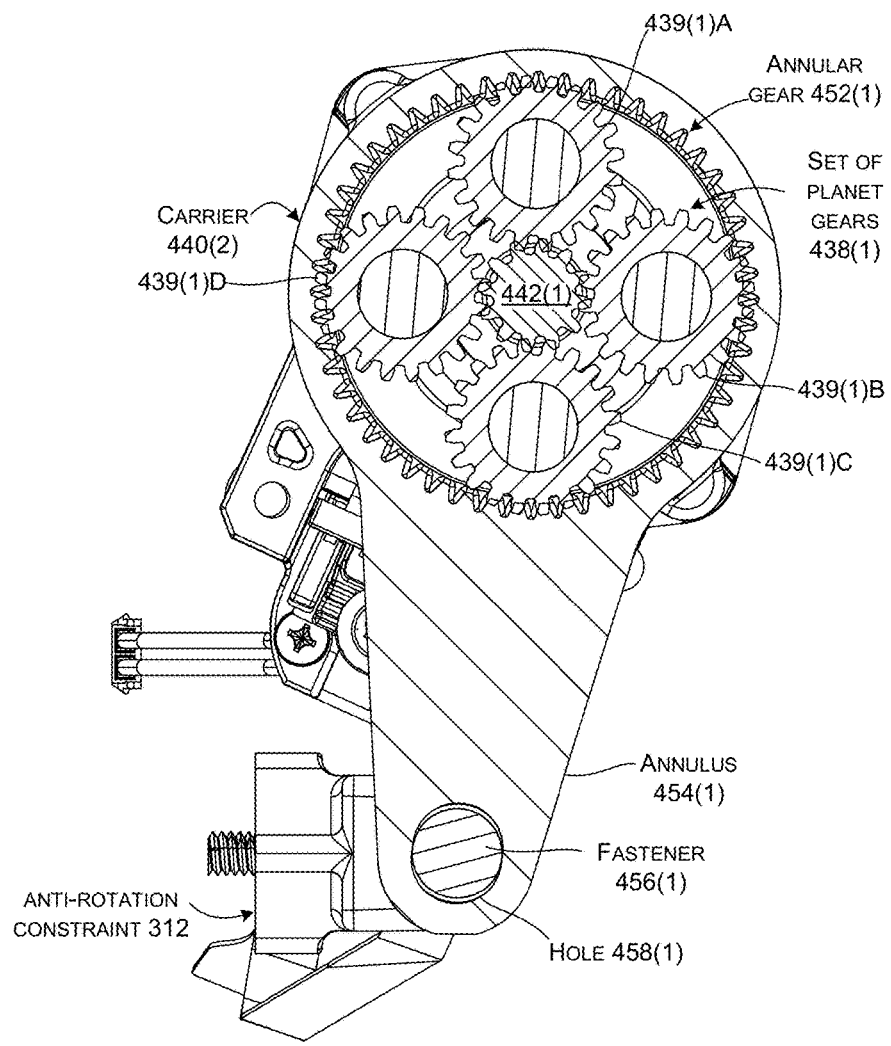
FIGS. 7A-7B and 8 are sectional views of example devices in accordance with the present concepts.
Figure 7B:
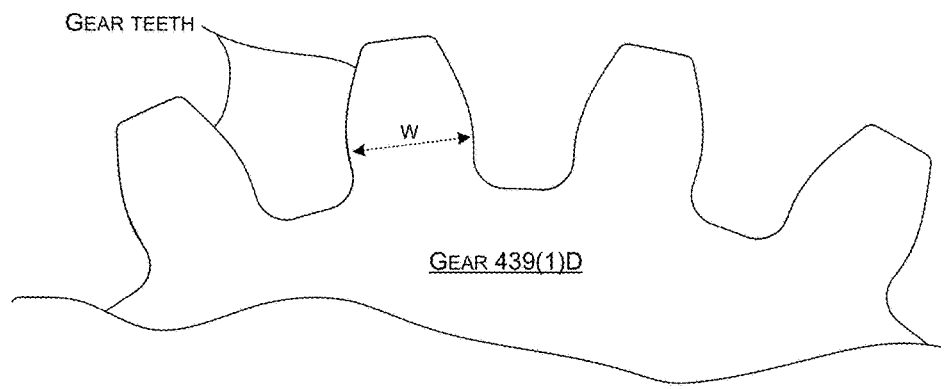
Figure 7B:
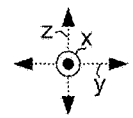
Figure 7C:
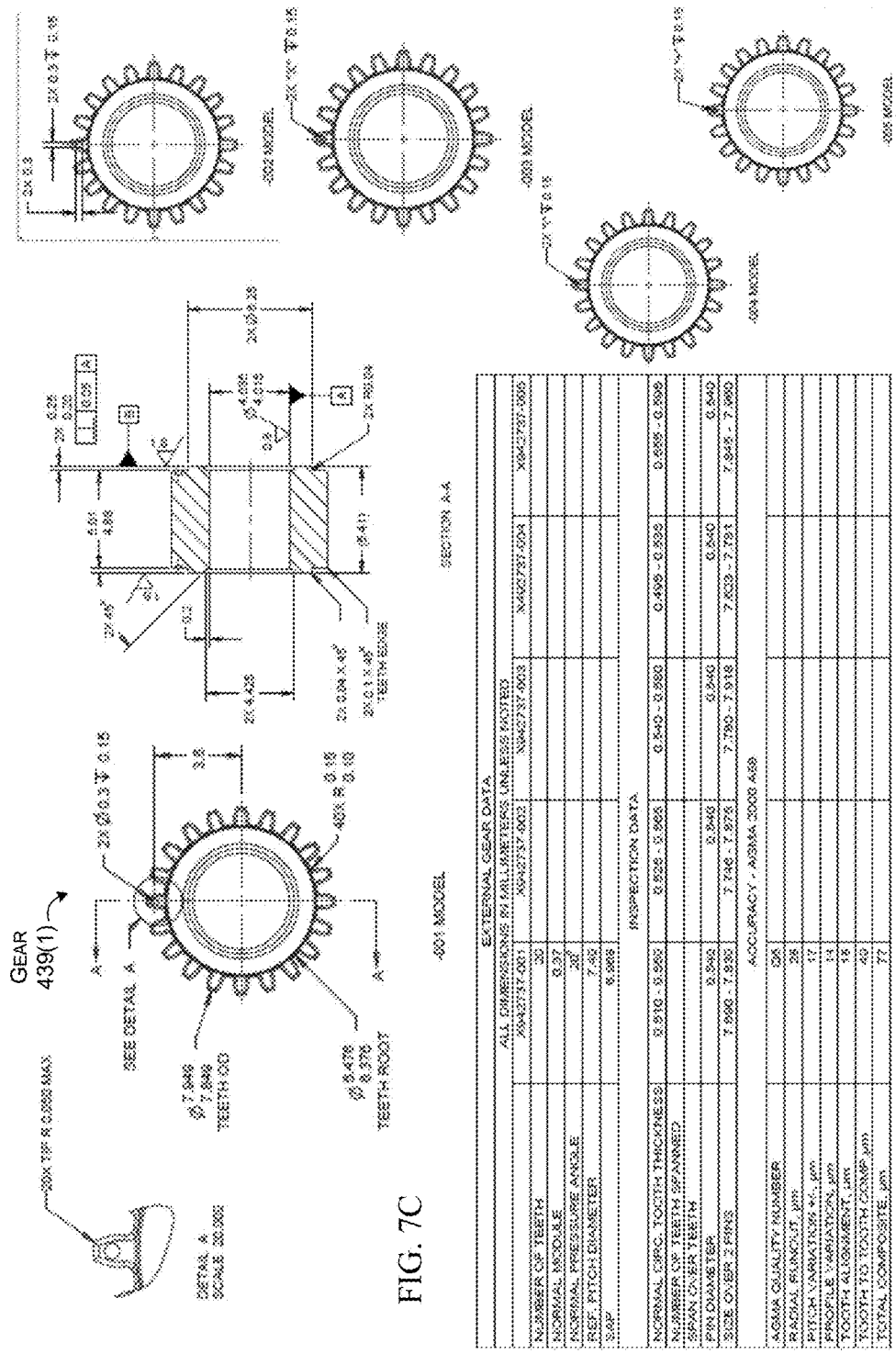
Figure 8:
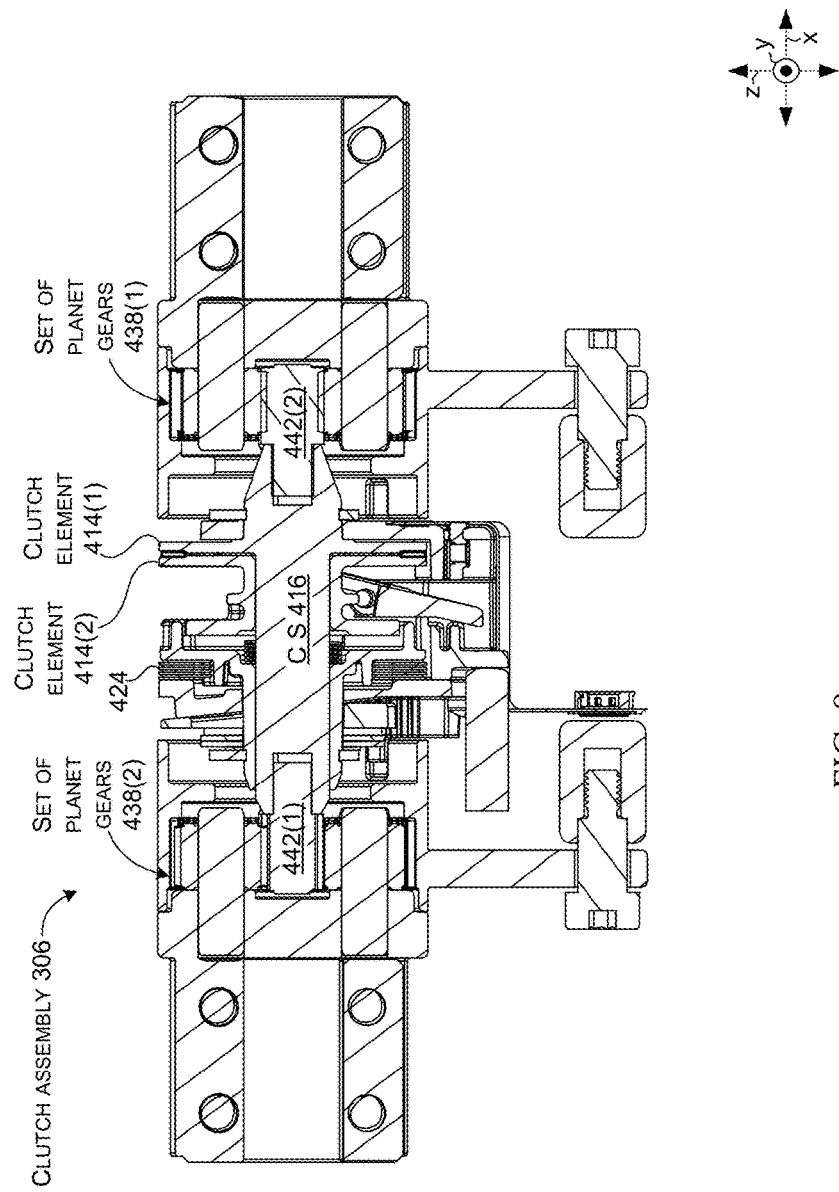

FIGS. 6-8 collectively show additional details of clutch system 302. FIGS. 6 and 7C are elevational views and FIGS. 7A, 7B, and 8 are sectional views through the clutch system 302 as indicated in FIG. 6. Employing two planet gear assemblies 308 can allow a single clutch in the clutch system 302 to achieve a higher maximum torque capacity.

FIG. 7A shows an example planet gear configuration that can increase clutch torque. FIGS. 7B and 7C show additional details about planet tooth configurations. In the example of FIGS. 7A-7C, the set of planet gears 438(1) includes four planet gears 439(1). This example can feature a gear ratio of 5.33-to-1 with 20-tooth planet gears, a 60-tooth annulus (ring gear) 452(1), and a 12-tooth sun gear 442(1). The planet gear sets can increase the torque capacity of the clutch assembly 306. In some cases, the planet gear sets can multiply force available at the clutch shaft 416. For example, the planet gear sets can increase a one Newton-meter clutch torque value to 5.3 Newton-meters. (The tooth count and torque values are provided for purposes of explanation and other tooth counts and torque values are contemplated). Also, tooth width can be variable between individual planet gears in a gear set in order to minimize backlash. The presence of a single gear in the gear set with wider gear tooth widths can minimize system backlash. These features are shown and described relative to FIGS. 7A-7C. Backlash in a gear train can occur due to clearances between the gear teeth necessary for assembly and motion without binding. If the clearances become too large, excessive backlash can result. If one or more of the planet gears can be easily replaced with another of slightly greater tooth width, then excessive backlash can be corrected when encountered during assembly. Another solution to control backlash can be to make a single planet gear with greater tooth width out of a softer material such as aluminum and/or a polymer. The remaining harder (e.g., steel) planet gears carry most of the torque, while the softer gear, with closer fit, can take up any objectionable backlash. The softer gear can allow some amount of interference due to manufacturing variation without binding.

FIG. 7B shows individual gear teeth on planet gear 439(1)D (only a portion of which is shown). A tooth width W is labeled for an individual tooth. In some implementations, tooth width can be different for one planet gear 439 compared to another planet gear. One such example is shown in FIG. 7C.

FIG. 7C shows tooth width (expressed as "normal circ. tooth thickness") on planet gear 439(1). Example tooth widths for an individual planet gear 439(1) are shown in individual columns of the width row. Thus, individual planet gears can have tooth widths that are different from at least one other planet gear of the set of planet gears 438(1) of FIG. 7A.

Returning to FIG. 7A, note also that in this case, fastener 456(1) has a circular cross-sectional profile. In contrast, hole 458(1) has a non-circular elliptical cross-sectional profile. This configuration can allow slight movement of the fastener 456(1) in the hole 458(1) which can alleviate binding (e.g., over constraint) while still tying the annulus 454(1) to the anti-rotation constraint 312.

FIG. 8 shows that the planet gear sets 438 are coupled to the clutch assembly 306's clutch shaft 416 by the sun gears 442, which can be pressed into clutch shaft 416 on both ends of the clutch assembly 306.

Looking at FIG. 8 in combination with FIGS. 4B and 4C, both sets of planet gears 438 have a rigid coupling half directly integrated into the body of the planet carrier (e.g., planet carrier 450 can be fixedly secured to retainer 460). Retainer 462 can be secured to retainer 460 around shaft (112(2), FIG. 3A) to constrain planet carrier 450 to shaft 112(2). In one case shown in FIGS. 4A-4C, four fasteners 408 can be used to secure the retainers together and to the shaft.

In review, in some implementations, the annulus brackets (440, FIG. 4C) are restrained from rotation by extending stand-offs from the planet gear assemblies 308. These stand-offs can be fastened to anti-rotation constraint 312, such that the planet gear assemblies 308 can move radially, but not rotate about the shafts (112(2), FIG. 3A). This effect can be achieved by slotting the stand-off holes (458, FIG. 7). The anti-rotation constraint 312 can be fastened to the display mount (107, FIG. 3A) to fix the anti-rotation constraint 312 in place after assembly.

Figure 9A:
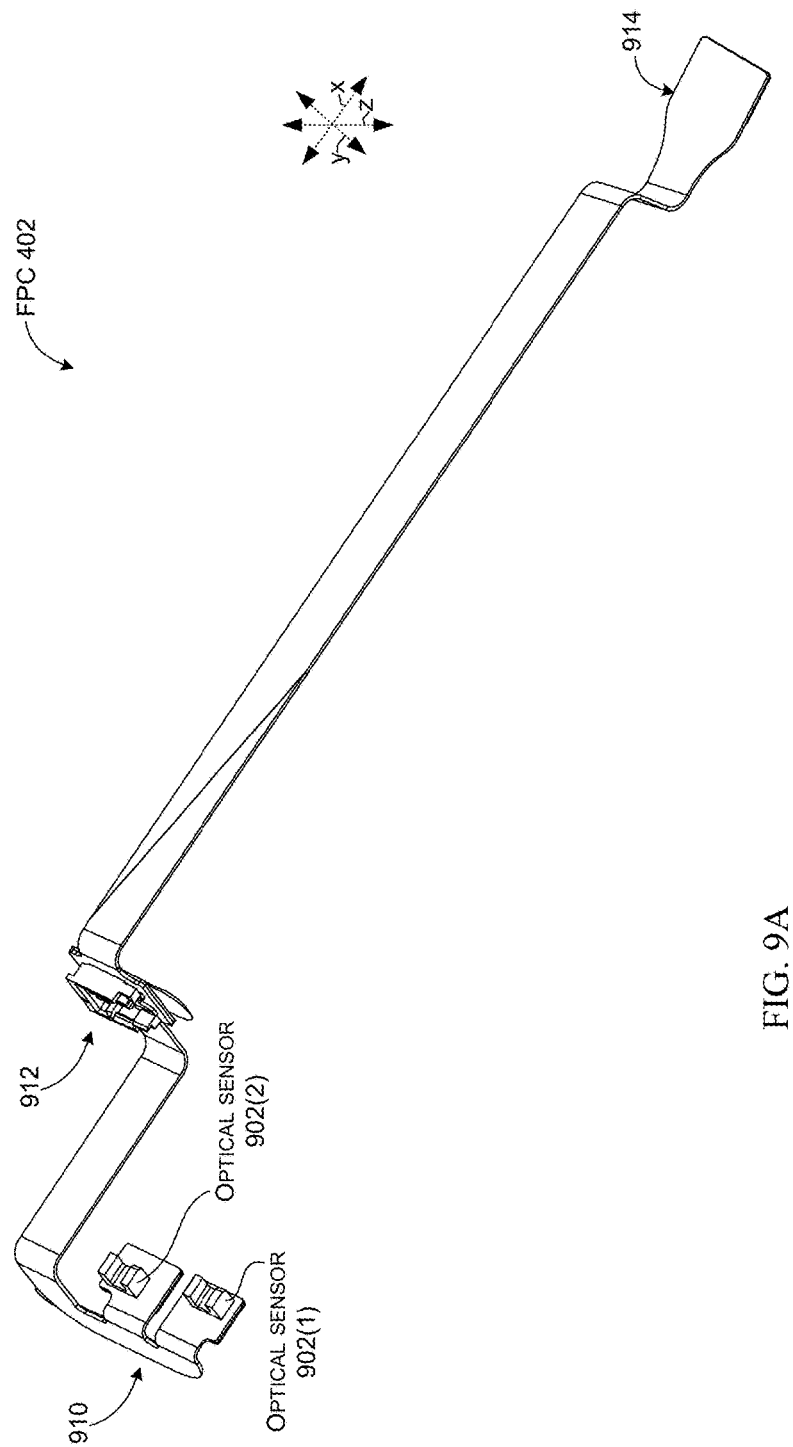

FIGS. 9A-9C collectively show additional detail about an implementation of optical sensors 902 on FPC 402. The FPC can both physically mount or position the optical sensors proximate to lead nut 508 and electrically couple the optical sensors to clutch controller (118, FIG. 1A). In some implementations, the lead nut 508 on the clutch assembly 306 can have two stand-off features 904(1) and 904(2) attached to the lead nut 508. The stand-off features 904 can extend into the optical sensors 902(1) and 902(2) respectively, during actuation. Thus, in this configuration, the optical sensors don't directly sense the position of the clutch elements 414. Instead, the optical sensors sense the position of another portion of the clutch assembly (e.g., in this case the lead nut 508). In other implementations, the optical sensors can directly sense the clutch elements 414. In either case, individual optical sensors 902 can provide an indication of the clutch element locations that can be used by the clutch controller to start and/or stop operation of the motor 504.

As evidenced in FIG. 9C, the optical sensors 902 can be positioned relative to a primary housing 906 (FIG. 9C, the primary housing is removed in FIG. 9B and in FIG. 5). To provide precise positioning of the optical sensors 902, some implementations can employ a secondary housing or bracket 908 (FIG. 9C) to control the position of the optical sensors even more precisely. For instance, the optical sensors 902 can be positioned relative to the primary housing and the secondary housing 908 can then be positioned over the optical sensors. For example, the secondary housing 908 can be friction fit (e.g., snapped) onto the primary housing 906 in a manner that precisely positions or aligns the optical sensors 902. In one configuration, the optical sensors can be sandwiched between the primary housing 906 and the secondary housing 908.

As shown in FIG. 9A, in some cases the FPC 402 can feature a "forked" variable bend design indicated at 910 (FIG. 9A) to accommodate different positional variations in the FPC's optical sensors 902. The FPC bend location can be variable and can be defined by the secondary housing 908, hub 412 and/or wedge housing 428 during each specific unit assembly. This alignment method can enable consistent position of the optical sensors 902(1) relative to the lead nut 508.

Note also that in some implementations, FPC 402 can also electrically couple the clutch controller (118, FIG. 1A) to motor 504 as indicated at 912. As such, in the illustrated configuration, clutch controller coupling 914 can include both low voltage circuits to the optical sensors 902 and high voltage circuits for driving the motor via motor coupling 912 (e.g., a single FPC to both power a clutch and control the clutch). Other implementations can use a first FPC for driving the motor and a second separate FPC for driving the motor.

Various device examples are described above. Additional examples are described below. One example includes a device comprising a display that is configured to rotate relative to an axis and further comprising a clutch assembly interposed between first and second planet gear assemblies and comprising a first clutch element and a second clutch element coupled to a clutch shaft that terminates at opposing first and second geared ends. The first planet gear assembly includes a first set of planet gears supported by a first annulus bracket that is positioned relative to a first shaft. The first set of planet gears is positioned relative to a first annular gear and the first geared end of the clutch shaft. The second planet gear assembly includes a second set of planet gears supported by a second annulus bracket that is positioned relative to a second shaft. The second set of planet gears is positioned relative to a second annular gear and the second end of the clutch shaft. The first shaft, second shaft, and the clutch shaft are co-extensive with the axis. The first annulus bracket comprises the first annular gear that is secured to the display and the second annulus bracket comprises the second annular gear that is secured to the display. The clutch assembly is configured to transition between a rotatable position where the first clutch element is separated from the second clutch element to allow the display to rotate around the axis and a locked position that locks rotation of the display by engaging the first clutch element against the second clutch element.

Another example can include any of the above and/or below examples where the first annulus and the second annulus are secured to the display at a shared central mount.

Another example can include any of the above and/or below examples where the first annulus and the second annulus are secured to the display via an anti-rotation constraint.

Another example can include any of the above and/or below examples where the first clutch element is fixed and the second clutch element is rotatable.

Another example can include any of the above and/or below examples where the geared ends comprise sun gears.

Another example includes a device comprising a display that is configured to rotate relative to opposing first and second display shafts; and a clutch assembly interposed between first and second planet gear assemblies positioned on the first and second display shafts and that are coupled to the display via a shared central mount where clutch engagement locks the display relative to the opposing first and second display shafts and clutch disengagement allows rotation of the display relative to the opposing first and second display shafts.

Another example can include any of the above and/or below examples where the shared central mount comprises an anti-rotation constraint.

Another example can include any of the above and/or below examples where the anti-rotation constraint is configured to allow radial movement of the first and second planet gear assemblies but prevent rotation of the clutch assembly and the first and second planet gear assemblies around the first and second display shafts.

Another example can include any of the above and/or below examples where the clutch assembly comprises first and second clutch elements, multiple slip elements, one or more conical spring washers, and a wedge adjuster constrained along a length of a clutch shaft.

Another example can include any of the above and/or below examples where the one or more conical spring washers are partially compressed, wherein the wedge adjuster has a varying thickness between an open end and a closed end such that an extent to which the one or more conical spring washers are compressed can be adjusted by moving the wedge adjuster orthogonally to the length of the clutch shaft.

Another example can include any of the above and/or below examples where the wedge adjuster has a varying thickness such that an extent to which the one or more conical spring washers are compressed can be adjusted by moving the wedge adjuster orthogonally to the length of the clutch shaft.

Another example can include any of the above and/or below examples where the varying thickness is stepped.

Another example can include any of the above and/or below examples where the wedge adjuster comprises a horseshoe shaped wedge adjuster.

Another example can include any of the above and/or below examples where the horseshoe shaped wedge adjuster has a stepped thickness between an open end and a closed end such that an extent to which the one or more conical spring washer are compressed can be adjusted by incrementally moving the horseshoe shaped wedge adjuster orthogonally to the length of the clutch shaft.

Another example can include a device, comprising a display that is configured to rotate relative to an axis and further comprising a clutch assembly interposed between first and second planet gear assemblies positioned along the axis, the first and second planet gears configured to multiply resistance to rotation around the axis that is supplied by the clutch assembly.

Another example can include any of the above and/or below examples where the clutch assembly includes a clutch shaft that includes first and second sun gears at opposing ends of the clutch shaft.

Another example can include any of the above and/or below examples where the first sun gear engages a first set of planet gears associated with the first planet gear assembly and the second sun gear engages a second set of planet gears associated with the second planet gear assembly.

Another example can include a device, comprising clutch elements located on a clutch shaft and driven by a motor via an actuator. The device further comprises a clutch controller configured to power the motor to control relative positions of the clutch elements. The device further comprises a single flexible printed circuit that extends from the clutch controller to the motor to enable the clutch controller to power the motor and that also includes sensors positioned proximate to the clutch elements to provide an indication to the clutch controller relating to the relative position of the clutch elements.

Another example can include any of the above and/or below examples where the sensors are positioned proximate to the actuator to provide indirect information about the relative positions of the clutch elements.

Another example can include any of the above and/or below examples where the sensors are positioned proximate to the clutch elements to provide direct information about the position of the clutch elements.

Another example can include any of the above and/or below examples where the sensors comprise optical sensors.

Another example can include a device comprising a display that is configured to rotate relative to a display shaft and further comprises a clutch assembly that includes a sun gear configured to engage a planet gear assembly positioned on the display shaft and that are coupled to the display, where clutch engagement locks the display relative to the display shaft and clutch disengagement allows rotation of the display relative to the display shaft.

Another example can include any of the above and/or below examples where the planet gear assembly includes multiple planet gears and where at least one planet gear has a first tooth width that is different from a second tooth width of another planet gear.

Another example can include a device, comprising a display that is configured to rotate relative to a shaft further comprising a clutch assembly with a first clutch element secured relative to the display, a planet gear assembly with a planet carrier secured relative to the shaft, and a sun gear secured relative to a second clutch element.

Another example can include any of the above and/or below examples where the clutch includes a clutch shaft that is co-extensive with the shaft.

Another example can include any of the above and/or below examples where the clutch includes a clutch shaft that is parallel to the shaft but not co-extensive with the shaft.

Although techniques, methods, devices, systems, etc., pertaining to clutch systems are described in language specific to structural features and/or methodological acts, it is to be understood that the subject matter defined in the appended claims is not limited to the specific features or acts described. Rather, the specific features and acts are disclosed as example forms of implementing the claimed methods, devices, systems, etc.

The invention claimed is:

1. A device, comprising:
a display that is configured to rotate relative to opposing first and second display shafts; and,
a clutch assembly interposed between first and second planet gear assemblies positioned on the first and second display shafts and that are coupled to the display via a shared central mount where clutch engagement locks the display relative to the opposing first and second display shafts and clutch disengagement allows rotation of the display relative to the opposing first and second display shafts, the clutch assembly comprising first and second selectively engageable clutch elements, at least one slip element, a wedge adjuster, and a wedge housing constrained along a length of a clutch shaft that is parallel to the first and second display shafts.

2. The device of claim 1, wherein the shared central mount comprises an anti-rotation constraint.

3. The device of claim 2, wherein the anti-rotation constraint is configured to allow radial movement of the first and second planet gear assemblies but prevent rotation of the clutch assembly and the first and second planet gear assemblies around the first and second display shafts.

4. The device of claim 1, wherein the at least one slip element comprises multiple slip elements and wherein the clutch assembly further comprises one or more conical spring washers constrained along the length of the clutch shaft.

5. The device of claim 4, wherein the wedge adjuster has a varying thickness between an open end and a closed end such that an extent to which the one or more conical spring washers are compressed can be adjusted by moving the wedge adjuster in the wedge housing orthogonally to the length of the clutch shaft.

6. The device of claim 4, wherein the wedge adjuster has a varying thickness such that an extent to which the one or more conical spring washers are compressed can be adjusted by moving the wedge adjuster in the wedge housing orthogonally to the length of the clutch shaft.

7. The device of claim 1, wherein the clutch shaft includes first and second sun gears at opposing ends of the clutch shaft.

8. The device of claim 7, wherein the first sun gear engages a first set of planet gears associated with the first planet gear assembly and the second sun gear engages a second set of planet gears associated with the second planet gear assembly.

9. A device comprising:
a display that is configured to rotate relative to opposing first and second display shafts; and,
a clutch assembly interposed between first and second planet gear assemblies positioned on the first and second display shafts and that are coupled to the display via a shared central mount where clutch engagement locks the display relative to the opposing first and second display shafts and clutch disengagement allows rotation of the display relative to the opposing first and second display shafts, the clutch assembly comprising both first and second selectively engageable clutch elements and also comprising at least one slip element, the first and second selectively engageable clutch elements and the at least one slip element constrained along a length of a clutch shaft that is parallel to the first and second display shafts, the first clutch element fixed with respect to the clutch shaft and the second clutch element rotatable and where the at least one slip element is configured to rotate under torsional loading before the second clutch element rotates in an instance where the first and second selectively engageable clutch elements are engaged.

10. A device, comprising:
a display that is configured to rotate relative to opposing first and second display shafts; and,
a clutch assembly interposed between first and second planet gear assemblies positioned on the first and second display shafts and that are coupled to the display via a shared central mount where clutch engagement locks the display relative to the opposing first and second display shafts and clutch disengagement allows rotation of the display relative to the opposing first and second display shafts, the clutch assembly including a wedge adjuster constrained along a length of a clutch shaft that is parallel to the first and second display shafts.

11. The device of claim 10, further comprising one or more conical spring washers constrained along the length of the clutch shaft, wherein the wedge adjuster has a horseshoe shape and a stepped thickness between an open end and a closed end such that an extent to which the one or more conical spring washers are compressed can be adjusted by incrementally moving the horseshoe shaped wedge adjuster orthogonally to the length of the clutch shaft.

12. A device, comprising:
a display that is configured to rotate relative to a display shaft; and,
a clutch assembly that includes a sun gear configured to engage a planet gear assembly positioned on the display shaft and that is coupled to the display, wherein clutch engagement locks the display relative to the display shaft and clutch disengagement allows rotation of the display relative to the display shaft, the planet gear assembly including multiple planet gears, at least one planet gear having a first tooth width that is different from a second tooth width of another planet gear.

13. A device, comprising:
a display that is configured to rotate relative to a display shaft; and,
a clutch assembly that includes a clutch shaft that is parallel to the display shaft but not co-extensive with the display shaft, the clutch assembly comprising a first clutch element secured relative to the display, a planet gear assembly with a planet carrier secured relative to the clutch shaft, and a sun gear secured relative to a second clutch element that is configured to selectively engage the first clutch element.

14. The device of claim 13, further comprising a motor that drives the clutch assembly via an actuator.

15. The device of claim 14, further comprising a clutch controller configured to power the motor to control relative positions of components of the clutch assembly.

16. The device of claim 15, further comprising a single flexible printed circuit that extends from the clutch controller to the motor to enable the clutch controller to power the motor.

17. The device of claim 15, further comprising sensors positioned proximate to the clutch assembly to provide an indication to the clutch controller relating to the relative positions of the components of the clutch assembly.

18. The device of claim 17, wherein the sensors are positioned proximate to the actuator to provide indirect information about the relative positions of the components of the clutch assembly.

19. The device of claim 17, wherein the sensors are positioned proximate to the components of the clutch assembly to provide direct information about the relative positions of the components.

20. The device of claim 17, wherein the sensors comprise optical sensors.

21. A device, comprising:
a display that is configured to rotate relative to a display shaft; and,
a clutch assembly including a clutch shaft that is parallel to the display shaft but not co-extensive with the display shaft, the clutch assembly comprising a first clutch element secured relative to the display, at least one slip element constrained along a length of the clutch shaft, a planet gear assembly with a planet carrier secured relative to the clutch shaft, and a sun gear secured relative to a second clutch element.

22. The device of claim 21, wherein the first clutch element is fixed and the second clutch element is rotatable.

23. The device of claim 21, further comprising a second planet gear assembly secured to the display, wherein the planet gear assembly and the second planet gear assembly comprise sets of planet gears supported by annular brackets secured to the display.

24. The device of claim 23, wherein the annular brackets are secured to the display via a shared central mount.

25. The device of claim 23, wherein the annular brackets are secured to the display via an anti-rotation constraint.

* * * * *